United States Patent
Lee et al.

(10) Patent No.: US 9,075,323 B2
(45) Date of Patent: Jul. 7, 2015

(54) EXPOSURE DEVICE, PHOTO-MASK, AND METHOD FOR MANUFACTURING LIQUID CRYSTAL DISPLAY

(75) Inventors: Jun Woo Lee, Seongnam-si (KR); Soo-Ryun Cho, Gunpo-si (KR); Baek Kyun Jeon, Yongin-si (KR); Joo Seok Yeom, Seoul (KR); Suk Hoon Kang, Seoul (KR); Kyoung Tae Kim, Osan-si (KR)

(73) Assignee: Samsung Display Co., Ltd., Yongin (KR)

( * ) Notice: Subject to any disclaimer, the term of this patent is extended or adjusted under 35 U.S.C. 154(b) by 795 days.

(21) Appl. No.: 13/285,789

(22) Filed: Oct. 31, 2011

(65) Prior Publication Data

US 2013/0003033 A1    Jan. 3, 2013

(30) Foreign Application Priority Data

Jun. 29, 2011    (KR) .................. 10-2011-0063825

(51) Int. Cl.
*G03F 7/20*    (2006.01)

(52) U.S. Cl.
CPC .............. *G03F 7/70475* (2013.01); *G03F 7/20* (2013.01); *G03F 7/2022* (2013.01)

(58) Field of Classification Search
CPC ..... G03F 7/20; G03F 7/2022; G03F 7/70208; G03F 7/70058; G03F 7/7045; G03F 7/70466; G03F 7/70475; G03F 1/144; G03F 7/70283; G03F 1/14; G02F 1/133753; G02F 2001/13625; G02F 1/1303
USPC ........... 355/53, 67; 349/123, 128, 129; 430/5, 430/17
See application file for complete search history.

(56) References Cited

U.S. PATENT DOCUMENTS

| | | | | |
|---|---|---|---|---|
| 5,286,584 A | * | 2/1994 | Gemmink et al. | 430/5 |
| 5,329,335 A | * | 7/1994 | Wada et al. | 355/53 |
| 5,437,946 A | * | 8/1995 | McCoy | 430/5 |
| 5,792,591 A | * | 8/1998 | Theuwissen | 430/312 |
| 6,714,271 B1 | * | 3/2004 | Matsuyama et al. | 349/123 |
| 7,081,935 B2 | * | 7/2006 | Chida et al. | 349/135 |
| 7,494,766 B2 | * | 2/2009 | Moon et al. | 430/319 |
| 2003/0138742 A1 | * | 7/2003 | Irie et al. | 430/396 |
| 2004/0069757 A1 | * | 4/2004 | Nakata et al. | 219/121.69 |
| 2004/0248020 A1 | * | 12/2004 | Fujikawa et al. | 430/22 |
| 2005/0074708 A1 | * | 4/2005 | Saluel et al. | 430/394 |

(Continued)

FOREIGN PATENT DOCUMENTS

WO    2007/086474    8/2007

*Primary Examiner* — Steven H Whitesell Gordon
(74) *Attorney, Agent, or Firm* — H.C. Park & Associates, PLC

(57) ABSTRACT

The present invention is directed to an exposure apparatus and photo-mask, and method for manufacturing liquid crystal display using the same. An exposure apparatus according to an exemplary embodiment of the present invention provides an exposure apparatus which includes: a first photo-mask comprising a plurality of transmission parts; and a second photo-mask comprising a plurality of transmission parts, the first photo-mask and the second photo-mask comprising an overlapping region where the first photo-mask and the second photo-mask are partially overlapped, wherein at least one transmission part included in at least one of the first photo-mask and the second photo-mask in the overlapping region comprises a semi-transmission section, and a transmittance of the semi-transmission section is greater than or equal to 0% and less than 100%.

15 Claims, 23 Drawing Sheets

(56) References Cited

U.S. PATENT DOCUMENTS

2005/0142458 A1* 6/2005 Lee et al. .......................... 430/5
2007/0026586 A1* 2/2007 Kim et al. ..................... 438/152
2010/0035190 A1* 2/2010 Jung et al. ..................... 430/322
2010/0085524 A1* 4/2010 Nakagawa ..................... 349/124
2010/0225864 A1* 9/2010 Inoue et al. ................... 349/123
2013/0169917 A1* 7/2013 Mizumura ..................... 349/123

* cited by examiner

FIG. 7
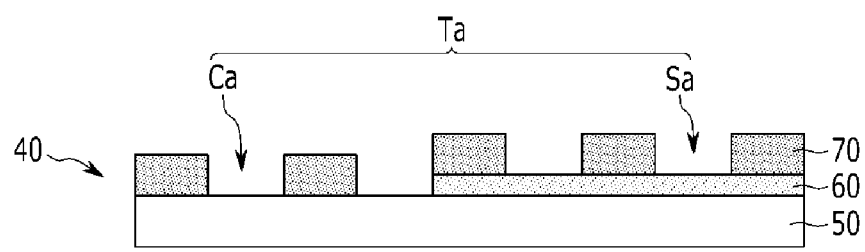
(a)
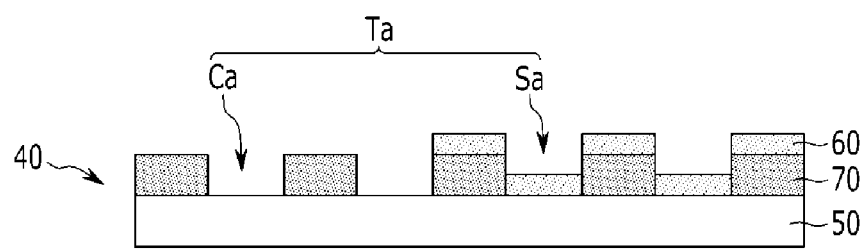
(b)

FIG. 22
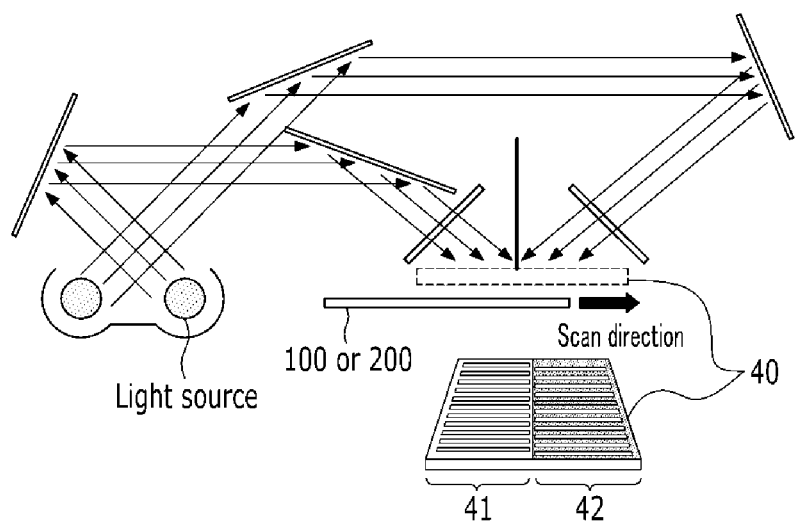
(a)
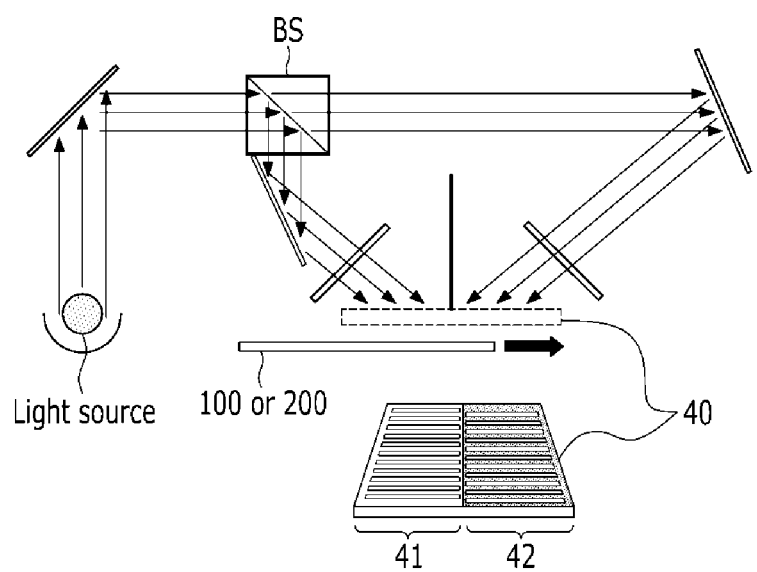
(b)

EXPOSURE DEVICE, PHOTO-MASK, AND METHOD FOR MANUFACTURING LIQUID CRYSTAL DISPLAY

CROSS-REFERENCE TO RELATED APPLICATION

This application claims priority from and the benefit of Korean Patent Application No. 10-2011-0063825 filed in the Korean Intellectual Property Office on Jun. 29, 2011, which is incorporated herein by reference for all purposes as if fully set forth herein.

BACKGROUND OF THE INVENTION

1. Field of the Invention

The present invention relates to an exposure apparatus for a photo-alignment process, and a manufacturing method of a liquid crystal display using the same.

2. Discussion of the Background

Liquid crystal displays (LCDs) are one of the most widely used types of flat panel displays. An LCD has two display panels on which field generating electrodes such as a pixel electrode and a common electrode are disposed, and a liquid crystal layer that is disposed between the two display panels. The liquid crystal display displays an image by applying a voltage to the field generating electrodes to generate an electric field on the liquid crystal layer, thereby realigning the orientation of liquid crystal molecules of the liquid crystal layer, and controlling the polarization of incident light.

Among the liquid crystal displays, a vertical alignment (VA) mode liquid crystal display which has long axes of the liquid crystal molecules arranged perpendicular to upper and lower display panels under no electric field has been in the limelight because of its high contrast ratio and easy implementation of a wide reference viewing angle.

In the vertical alignment (VA) mode liquid crystal display, to realize a wide viewing angle, a plurality of domains having various alignment directions may be formed in a pixel. As a measure to form a plurality of domains in a pixel, a photo-alignment method, which irradiates ultraviolet beams to an alignment layer including a photo-reactive material to control an alignment direction and an alignment angle of a liquid crystal molecule, has been developed.

The above information disclosed in this Background section is provided only for the purpose of facilitating the understanding of the background of the invention, and therefore it may contain information that does not constitute prior art that is already known to a person of ordinary skill in the art.

SUMMARY OF THE INVENTION

The present invention provides an exposure apparatus using two or more photo-masks in a photo-alignment process of a liquid crystal display, and a method for manufacturing the liquid crystal display using the same.

Additional features of the invention will be set forth in the description which follows, and in part will be apparent from the description, or may be learned by practice of the invention.

An exposure apparatus according to an exemplary embodiment of the present invention includes: a first photo-mask comprising a plurality of transmission parts; and a second photo-mask comprising a plurality of transmission parts, the first photo-mask and the second photo-mask comprising an overlapping region where the first photo-mask and the second photo-mask are partially overlapped, wherein at least one transmission part included in at least one of the first photo-mask and the second photo-mask in the overlapping region comprises a semi-transmission section, and a transmittance of the semi-transmission section is greater than or equal to 0% and less than 100%.

An exposure apparatus according to another exemplary embodiment of the present invention includes: a first photo-mask comprising a plurality of transmission parts; a second photo-mask comprising a plurality of transmission parts; and a light irradiator, wherein the first photo-mask and the second photo-mask comprise an overlapping region where the first photo-mask and the second photo-mask are partially overlapped, each of the first photo-mask and the second photo-mask comprises a first portion and a second portion having different irradiation regions, the light irradiator is configured to irradiate a first beam and a second light beam, having different irradiation directions from each other, passing through the transmission parts of the first portion and the transmission parts of the second portion, respectively, at least one transmission part included in at least one of the first photo-mask and the second photo-mask in the overlapping region includes a semi-transmission section, and a transmittance of the semi-transmission section is greater than or equal to 0% and less than 100%.

A method for manufacturing a liquid crystal display according to an exemplary embodiment of the present invention with a first photo-mask and a second photo-mask, the first photo-mask comprising a plurality of transmission parts and the second photo-mask comprising a plurality of transmission parts, the first photo-mask and the second photo-mask comprising an overlapping region where the first photo-mask and the second photo-mask are partially overlapped, at least one transmission part included in at least one of the first photo-mask and the second photo-mask in the overlapping region comprising a semi-transmission section whose transmittance is greater than or equal to 0% and less than 100%, includes: coating an alignment layer comprising a photo-reactive alignment material on a substrate; and irradiating light to the alignment layer through the first photo-mask and second photo-mask.

A method for manufacturing a liquid crystal display according to another exemplary embodiment of the present invention with an exposure apparatus having a first photo-mask and a second photo-mask, the first photo-mask comprising a plurality of transmission parts, the second photo-mask comprising a plurality of transmission parts, and a light irradiator, the first photo-mask and the second photo-mask comprising an overlapping region where the first photo-mask and the second photo-mask are partially overlapped, each of the first photo-mask and the second photo-mask comprising a first portion and a second portion having different irradiation regions, at least one transmission part included in at least one of the first photo-mask and the second photo-mask in the overlapping region comprising a semi-transmission section whose transmittance is greater than or equal to 0% and less than 100%, includes: coating an alignment layer comprising a photo-reactive alignment material on a substrate; and irradiating a first light beam and a second light beam, having different irradiation directions from each other, through the transmission parts of the first portion and the transmission parts of the second portion onto the alignment layer, respectively.

A photo-mask according to an exemplary embodiment of the present invention includes: a substrate; a plurality of first transmission parts disposed on a first region of the substrate; and a plurality of second transmission parts disposed on a second region of the substrate, wherein the plurality of first transmission parts and the plurality of second transmission parts are arranged in series at predetermined intervals, and at least a portion of the plurality of second transmission parts each comprise semi-transmission section whose transmittance is greater than 0% and less than 100%.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 7 is a cross-sectional view of photo-masks for use in a photo-alignment its process according to an exemplary embodiment of the present invention.

FIG. 22 is a view showing a photo-alignment process according to an exemplary embodiment of the present invention.

DETAILED DESCRIPTION OF THE ILLUSTRATED EMBODIMENTS

Figure 1:
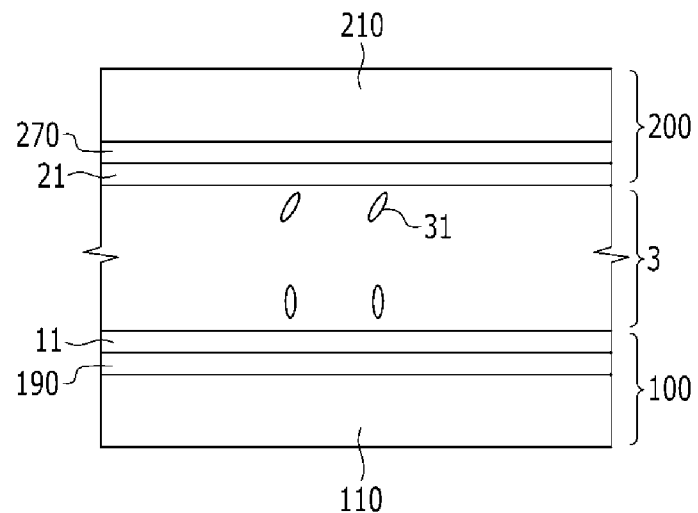
FIG. 1 is a cross-sectional view of a liquid crystal display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Firstly, a liquid crystal display according to an exemplary embodiment of the present invention will be described with reference to FIG. 1.

FIG. 1 is a cross-sectional view of a liquid crystal display according to an exemplary embodiment of the present invention.

As shown in FIG. 1, a liquid crystal display according to an exemplary embodiment of the present invention may include a lower panel 100 and an upper panel 200, and a liquid crystal layer 3 interposed between the two display panels 100 and 200.

Referring to the lower panel 100, a plurality of signal lines (not shown) and switching elements (not shown) such as thin film transistors connected thereto may be disposed on an insulating substrate 110, and a plurality of pixel electrodes 190 connected to the switching elements may be disposed thereon. An alignment layer 11 may be coated on the pixel electrode 190.

Referring to the upper panel 200, an opposing electrode 270 facing the pixel electrode 190 may be disposed on an insulating substrate 210, and an alignment layer 21 may be coated thereon.

The alignment layers 11 and 21 may be vertical alignment layers, and include a photo-reactive alignment material that reacts to light such as ultraviolet beams. The photo-reactive alignment material may have an alignment force such that liquid crystal molecules 31 aligned perpendicular to the surfaces of the substrates 110 and 210 are inclined with a predetermined azimuth angle, that is, a pretilt angle, with respect to a tangent line of the surface of each of the substrates 110 and 210. The alignment force of the alignment layers 11 and 21 may be based on azimuthal anchoring energy between the liquid crystal molecules 31 and the surface of each of the alignment layers 11 and 21. The direction of the alignment force of the alignment layers 11 and 21 or the alignment direction of the liquid crystal molecules 31 accordingly may depend on various factors such as an irradiation direction to the alignment layers 11 and 21. Also, the pretilt angle of the liquid crystal molecules caused by the alignment force may depend on various factors such as exposure energy and the slope of irradiation. These alignment layers 11 and 21 may be formed by reactions of the photo-reactive alignment material such as photo-isomeration, photolysis, photo-hardening, and photo-polymerization.

The liquid crystal molecules 31 of the liquid crystal layer 3 may have dielectric anisotropy and may be aligned to be substantially perpendicular to the surface of the two substrates 110 and 210. They may be, however, inclined at a predetermined pretilt angle with respect to tangent lines of the substrates 110 and 210 according to the alignment force generated from the combination with the photo-reactive alignment materials of the alignment layers 11 and 21 near the surfaces of the alignment layers 11 and 21. The liquid crystal molecules 31 away from the substrates 110 and 210 may be aligned to form a pretilt angle in a direction defined by the alignment force of either of the alignment layer 11 and 21 whichever is closer to the liquid crystal molecules 31. Around the middle portion of the liquid crystal layer 3, the liquid crystal molecules 31 may be inclined with a pretilt angle in a direction of an average degree of two alignment directions of the liquid crystal molecules 31 near the two display panels 100 and 200.

On the other hand, the liquid crystal display may include a plurality of pixels PX as a unit for displaying images, and in the case of the vertical alignment (VA) mode liquid crystal display, to realize a wide viewing angle, multiple domains each having different alignment direction of the liquid crystal molecules 31 may be formed in a pixel PX.

Hereinafter, a method for manufacturing the liquid crystal display according to an exemplary embodiment of the present invention will be described.

A plurality of thin films may be deposited and a pixel electrode 190 may be disposed on an insulating substrate 110. Next, a photo-reactive alignment material may be coated on the pixel electrode 190, and an alignment layer 11 may be completed through a photo-alignment process of irradiating light, such as ultraviolet beams, to the photo-reactive alignment material. Likewise, an opposing electrode 270 may be disposed on an insulating substrate 210, and an alignment layer 21 may be completed through a photo-alignment process of irradiating light, such as ultraviolet beams, to the photo-reactive alignment material. Next, a liquid crystal material may be injected between the two display panels 100 and 200 to form a liquid crystal layer 3.

Hereinafter, an exposure apparatus for use in the photo-alignment process according to an exemplary embodiment of the present invention will be described with reference to FIG. 2, FIG. 3, FIG. 4A, FIG. 4B, FIG. 4C, and FIG. 4D.

Figure 2:
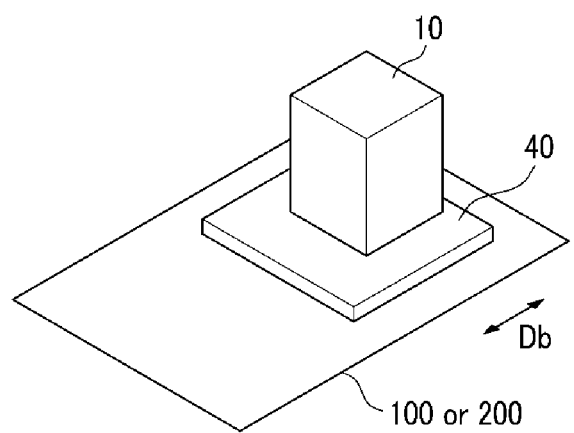
FIG. 2 is a schematic diagram of an exposure apparatus according to an exemplary embodiment of the present invention.
Figure 3:
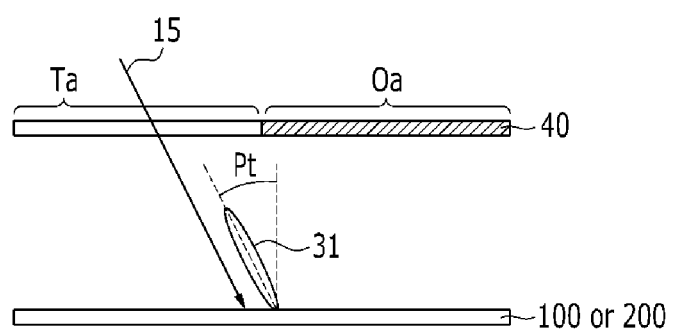
FIG. 3 is a view showing a photo-alignment process according to an exemplary embodiment of the present invention.

FIG. 2 is a schematic diagram of an exposure apparatus according to an exemplary embodiment of the present invention, FIG. 3 is a view showing a photo-alignment process according to an exemplary embodiment of the present invention, and FIG. 4A, FIG. 4B, FIG. 4C, and FIG. 4D are top plan views showing an alignment direction of a liquid crystal molecule of an alignment layer and an alignment direction of a liquid crystal molecule for a pixel.

As shown in FIG. 2, an exposure apparatus according to an exemplary embodiment of the present invention may include at least one photo-mask 40 and a light source 10. The photo-mask 40 and the light source 10 may integrally move to scan the display panels 100 and 200 in a second direction Db, or the photo-mask 40 and the light source 10 may be fixed and the display panel 100 and 200 may move. The light source 10 may emit light such as ultraviolet beams, and the light may be partially polarized ultraviolet beams or linearly polarized ultraviolet beams.

Referring to FIG. 3, the photo-mask 40 of the exposure apparatus according to an exemplary embodiment of the present invention may include a transmission part Ta that transmits light and a light blocking part Oa that blocks light. The transmission part Ta and the light blocking part Oa may be alternately provided. Light 15 emitted from the light source 10 may be irradiated to the photo-reactive alignment material of the alignment layer 11 or 21 of the display panel 100 or 200 through the transmission part Ta of the photo-mask 40 to induce a photo-reaction such as a photo-polymerization reaction. If the light is obliquely irradiated with respect to the surface of the display panel 100 or 200, the liquid crystal molecules 31 near the surface of the display panel 100 and 200, after injection thereof, will be inclined such that the long axes thereof form a predetermined azimuth angle, that is, a pretilt angle Pt, with respect to tangent lines of the surfaces of the display panels 100 and 200.

On the other hand, to form multiple domains in a pixel PX of the liquid crystal display, the light irradiation direction may be varied for a pixel PX. The exemplary embodiments with varying light irradiation directions will be described with reference to FIG. 4A, FIG. 4B, FIG. 4C, and FIG. 4D.

Figure 4A:
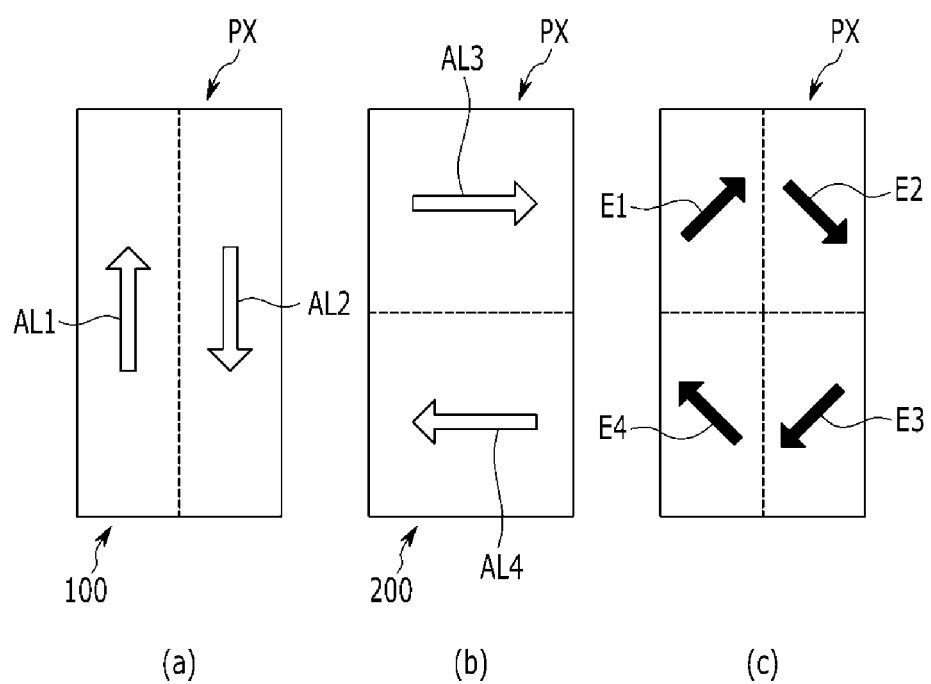
FIG. 4A, FIG. 4B, FIG. 4C, and FIG. 4D are top plan views showing an alignment direction for a liquid crystal molecule of an alignment layer and an alignment direction of a liquid crystal molecule for one pixel.

Firstly, referring to FIG. 4A (a), a photo-mask 40 may be arranged on a lower panel 100 of a liquid crystal display according to an exemplary embodiment of the present invention, and the light may be obliquely irradiated in an alignment direction AL1. Thus, for the left portion of the pixel PX, the direction of the pretilt angle of the liquid crystal molecules 31 near the surface of the lower panel 100 may become an alignment direction AL1. Also, the light may be obliquely irradiated, simultaneously with or after the light irradiation to the left portion of the pixel PX, to the right portion of the pixel PX in an alignment direction AL2 opposite to the alignment direction AL1, when viewed perpendicularly to the panel from above, such that the liquid crystal molecules 31 near the surface of the lower panel 100 may be pretilted in the alignment direction AL2.

Similarly, as shown in FIG. 4A (b), the photo-mask 40 may be arranged on the upper panel 200 and the light may be obliquely irradiated in an alignment direction AL3 and an alignment direction AL4 that are opposite directions to each other, when viewed perpendicularly to the panel from above, such that the pretilt directions of the liquid crystal molecules 31 near the surface of the upper panel 200 may be the alignment direction AL3 and the alignment direction AL4 for a pixel.

After this photo-alignment process, if the two display panels 100 and 200 are combined and a liquid crystal material is injected to complete a liquid crystal panel, the liquid crystal molecules 31 may be aligned in different alignment directions E1, E2, E3, and E4 as shown in FIG. 4A (c) around the middle portion of the liquid crystal layer 3. Accordingly, four domains having different alignment directions may be formed in a pixel PX. The alignment directions E1, E2, E3, and E4 shown in FIG. 4A (c) each may be an average alignment direction of the liquid crystal molecules 31 for the total thickness direction of the liquid crystal layer 3 for the respective domains.

Figure 4B:
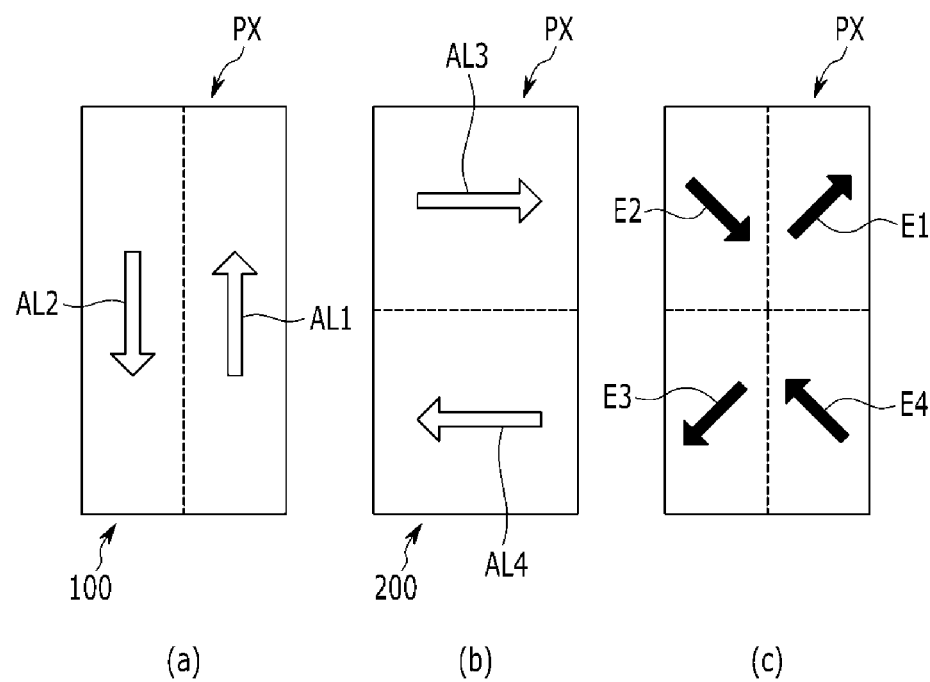

The method for photo-alignment according to the exemplary embodiment shown in FIG. 4B may be the same as the exemplary embodiment shown in FIG. 4A, except that the light irradiation directions to the lower panel 100 are different from those shown in the exemplary embodiment in FIG. 4A. For example, referring to FIG. 4B (a), the light may be irradiated to the lower panel 100 of the liquid crystal display according to an exemplary embodiment of the present invention such that the pretilt direction of the liquid crystal molecules 31 of the lower panel 100 at the right portion of the pixel PX becomes the alignment direction AL1, and the pretilt direction of the liquid crystal molecules 31 of the lower panel 100 at the left portion of the pixel PX becomes the alignment direction AL2. Referring to FIG. 4B (b), for the pixel PX of the upper panel 200 of the liquid crystal display according to an exemplary embodiment of the present invention, the pretilt direction of the liquid crystal molecules 31 may be the same as that of FIG. 4A (b). After the photo-alignment process for the two display panels 100 and 200, if the two display panels 100 and 200 are combined and the liquid crystal material is injected to complete the liquid crystal panel, the liquid crystal molecules 31 may be aligned as shown in FIG. 4B (c) around the middle portion of the liquid crystal layer 3. Specifically, the liquid crystal molecules 31 of the right upper portion of the pixel PX may be pretilted in the alignment direction E1 pointing right upper side, the liquid crystal molecules 31 of the right lower portion of the pixel PX may be pretilted in the alignment direction E4 pointing left upper side, the liquid crystal molecules 31 of the left lower portion of the pixel PX may be pretilted in the alignment direction E3 pointing left lower side, and the liquid crystal molecules 31 of the left upper portion of the pixel PX may be pretilted in the alignment direction E2 pointing right lower side.

Figure 4C:
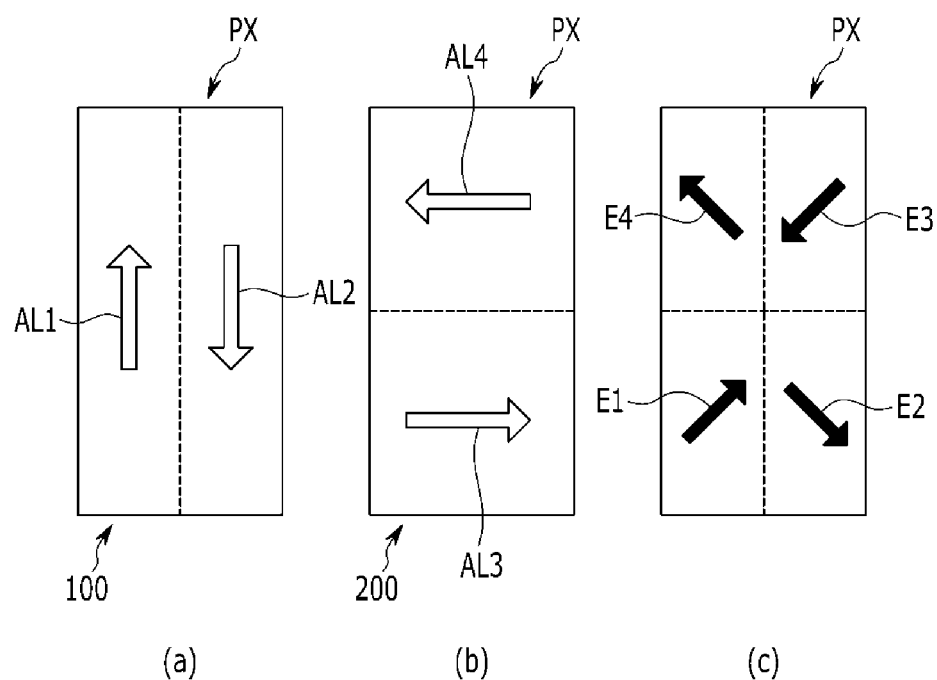

The method for photo-alignment according to the exemplary embodiment shown in FIG. 4C may be the same as that of the exemplary embodiment shown in FIG. 4A, except that the light irradiation direction to the upper panel 200 is different from that of the exemplary embodiment shown in FIG. 4A. Referring to FIG. 4C (a), for the pixel PX of the lower panel 100 of the liquid crystal display according to an exemplary embodiment of the present invention, the pretilt direction of the liquid crystal molecules 31 may be the same as that of FIG. 4A (a). Referring to FIG. 4C (b), the light may be irradiated to the upper panel 200 of the liquid crystal display according to an exemplary embodiment of the present invention such that the pretilt direction of the liquid crystal molecules 31 near the surface of the upper panel 200 becomes the alignment direction AL4 for the upper portion of the pixel PX and the pretilt direction of the liquid crystal molecules 31 near the surface of the upper panel 200 becomes the alignment direction AL3 for the lower portion of the pixel PX. If the liquid crystal panel is completed through combining the two display panels 100 and 200, the liquid crystal molecules 31 may be aligned as shown in FIG. 4C (c) around the middle portion of the liquid crystal layer 3. Specifically, the liquid crystal molecules 31 of the right upper portion of the pixel PX may be pretilted in the alignment direction E3 pointing left lower side, the liquid crystal molecules 31 of the right lower portion of the pixel PX may be pretilted in the alignment direction E2 pointing right lower side, the liquid crystal molecules 31 of the left lower portion of the pixel PX may be pretilted in the alignment direction E1 pointing right upper side, and the liquid crystal molecules 31 of the left upper portion of the pixel PX may be pretilted in the alignment direction E4 pointing left upper side.

Figure 4D:
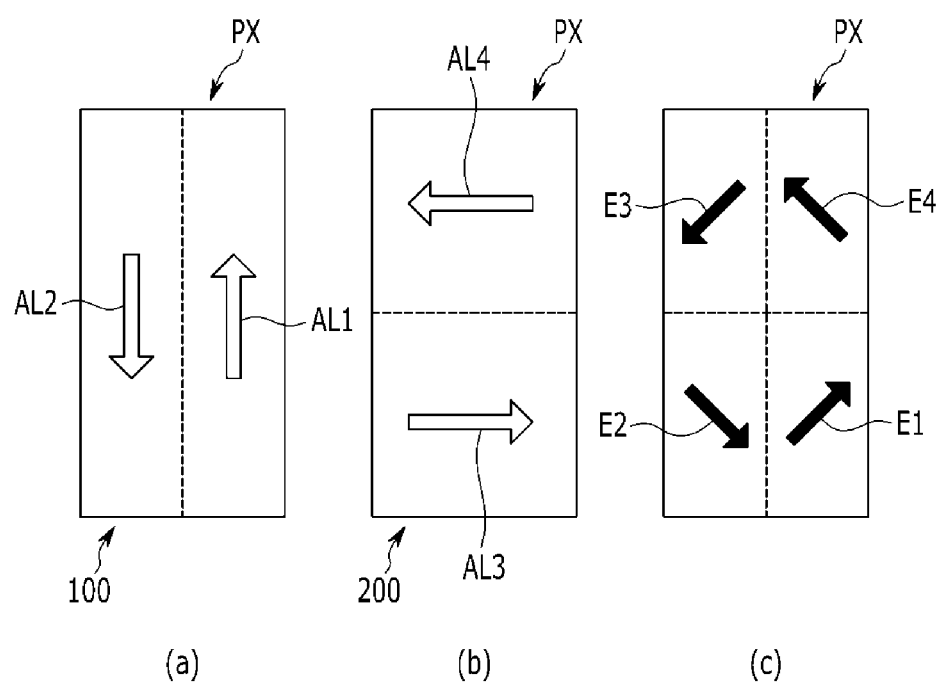

The method for photo-alignment according to the exemplary embodiment shown in FIG. 4D may be the same as that of the exemplary embodiment shown in FIG. 4A, except that the light irradiation direction to the two display panels 100 and 200 is different from that of the exemplary embodiment shown in FIG. 4A. For example, referring to FIG. 4D (a), for the left and right portions of the pixel PX of the lower panel 100 of the liquid crystal display according to an exemplary embodiment of the present invention, the pretilt direction of the liquid crystal molecules 31 near the surface of the lower panel 100 may be opposite to the direction shown in FIG. 4A (a), and for the upper and lower portions of the pixel PX of the upper panel 200, the pretilt direction of the liquid crystal molecules 31 near the surface of the upper panel 200 may be opposite to the direction shown in FIG. 4A (a). Accordingly, if the liquid crystal panel is completed by combing the two display panels 100 and 200, for the liquid crystal molecules 31 around the middle portion of the liquid crystal layer 3, as shown in FIG. 4D (c), the liquid crystal molecules 31 of the right upper portion of the pixel PX may be pretilted in the alignment direction E4 pointing left upper side, the liquid crystal molecules 31 of the right lower of the pixel PX may be pretilted in the alignment direction E1 pointing right upper side, the liquid crystal molecules 31 of the left lower portion of the pixel PX may be pretilted in the alignment direction E2 pointing right lower side, and the liquid crystal molecules 31 of the left upper portion of the pixel PX may be pretilted in the alignment direction E3 pointing left lower side.

Hereinafter, a photo-mask according to an exemplary embodiment of the present invention for use in the photo-alignment process will be described with reference to FIG. 5, FIG. 6, and FIG. 7.

Figure 5:
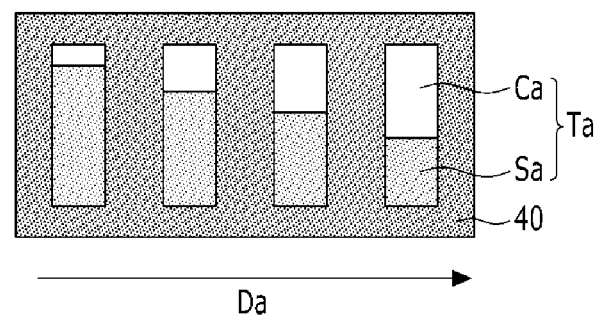
FIG. 5 and FIG. 6 are top plan views of photo-masks for use in a photo-alignment process according to an exemplary embodiment of the present invention.
Figure 6:
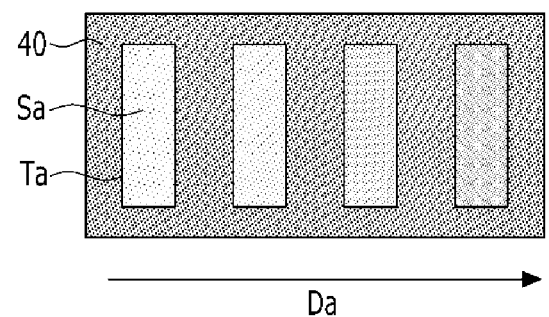

FIG. 5 and FIG. 6 are top plan views of photo-masks for use in a photo-alignment process according to an exemplary embodiment of the present invention, and FIG. 7 is a cross-sectional view of photo-masks for use in a photo-alignment process according to an exemplary embodiment of the present invention.

Referring to FIG. 5, FIG. 6, and FIG. 7, a photo-mask 40 according to an exemplary embodiment of the present invention may include a plurality of transmission parts Ta transmitting light, and each of the transmission parts Ta may include a semi-transmission section Sa partially transmitting light.

While the drawings show rectangular-shaped transmission parts Ta, the shape of the transmission parts Ta is not limited thereto and it may have various shapes. Also, in an exemplary embodiment of the present invention, the length of a second direction (not shown) perpendicular to the first direction Da may be longer than the length of the first direction Da of the transmission part Ta.

A ratio of an area occupied by the semi-transmission section Sa in each transmission part Ta is 0-100%, and the remaining portion thereof may be a full transmission part Ca. If the ratio of the transmitted light to the incident light is defined as transmittance, the transmittance of the semi-transmission section Sa may vary according to the thickness or the type of a material forming the semi-transmission section Sa, and the range thereby may be greater than 0% and less than 100%. Meanwhile, the transmittance of the full transmission section Ca may be 100%.

In a structure shown in FIG. 7 (a) and FIG. 7 (b), the photo-mask 40 according to an exemplary embodiment of the present invention may include a semi-transmission layer 60 disposed on a substrate 50 and a light blocking layer 70 disposed on the semi-transmission layer 60. The semi-transmission layer 60 may be made of a material that partially transmits the light, and the transmittance of the semi-transmission layer 60 for the incident light may vary in the range of 0-100% according to the material or the thickness thereof. For example, as the thickness of the semi-transmission layer 60 is increased, the transmittance of the semi-transmission layer 60 is decreased. The light blocking layer 70 blocks the transmission of light. The portion occupied by the semi-transmission layer 60 among the portion that is not covered by the light blocking layer 70 of the photo-mask 40 corresponds to the semi-transmission section Sa, and the portion in which the semi-transmission layer 60 is not disposed corresponds to the full transmission part Ca. FIG. 7 (a) shows an example in which the semi-transmission layer 60 is disposed between the substrate 50 and the light blocking layer 70, whereas FIG. 7 (b) shows an example in which the semi-transmission layer 60 is disposed on the surface of the light blocking layer 70 which is disposed on the substrate 50.

The effective transmittance of each transmission part Ta may be calculated by Equation 1 below.

Effective transmittance(%)=area of full transmission section Ca/area of transmission part Ta+area of semi-transmission section Sa*transmittance of semi-transmission section Sa/area of transmission part Ta  [Equation 1]

The effective transmittance of the transmission part Ta as a value considering the full transmission section Ca and the semi-transmission section Sa is a ratio of the transmitted light with respect to the incident light. As shown in Equation 1, in an exemplary embodiment of the present invention, assuming that the area of the transmission part Ta is constant, the effective transmittance of the transmission part Ta may be appropriately changed according to the ratio of the area of the semi-transmission section Sa with respect to the area of the transmission part Ta, and the transmittance of the semi-transmission section Sa. The transmittance of the semi-transmission section Sa may be appropriately changed by controlling the thickness or changing a kind of the material of the semi-transmission section Sa or the semi-transmission layer 60.

Table 1 shows the area (%) of the semi-transmission section Sa according to the transmittance of the semi-transmission section Sa and the effective transmittance of the transmission part Ta. In an exemplary embodiment of the present invention, the transmittance of the semi-transmission section Sa may be in the range of 5-80%. In other exemplary embodiments, the transmittance of the semi-transmission section Sa may be in the range of 20-70%.

the semi-transmission section Sa along the first direction Da may be increased such that the effective transmittance of the transmission part Ta may be decreased.

Hereinafter, a structure and an arrangement of an exposure apparatus according to an exemplary embodiment of the present invention will be described with reference to FIG. 8, FIG. 9, FIG. 10, FIG. 11, FIG. 12, and FIG. 13.

Figure 8:
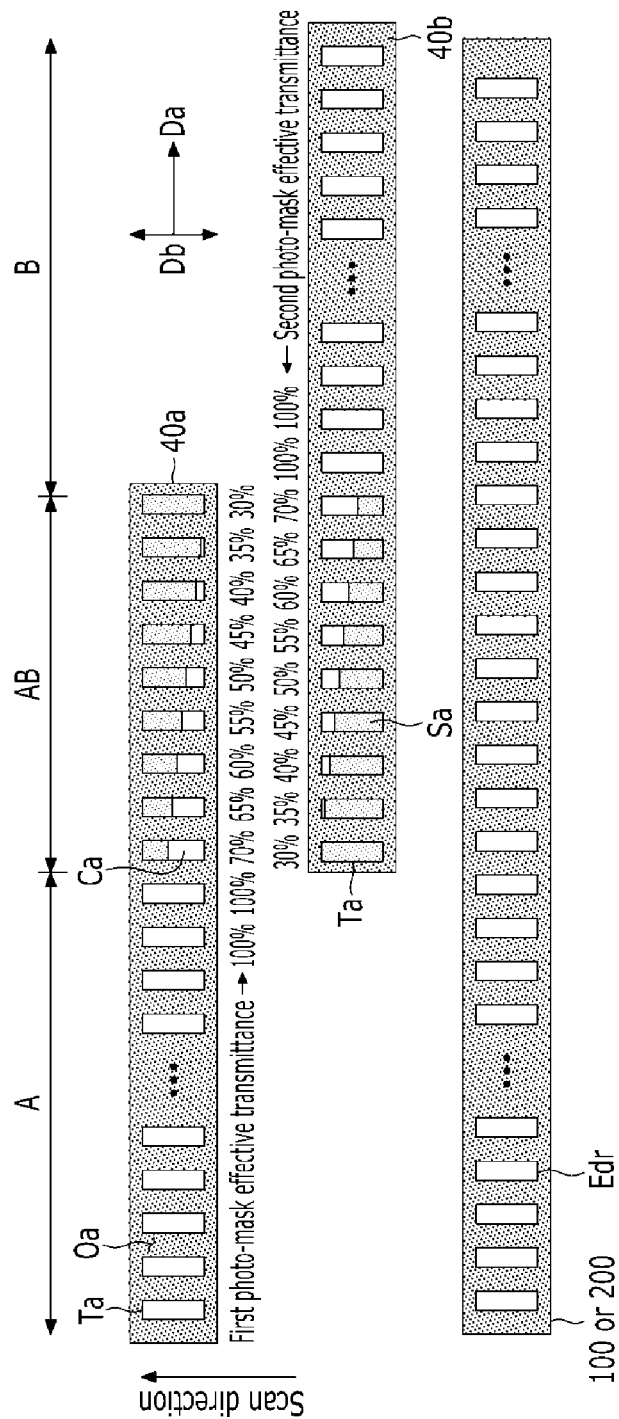
FIG. 8 is a top plan view of photo-masks for use in a photo-alignment process according to an exemplary embodiment of the present invention.
Figure 9:
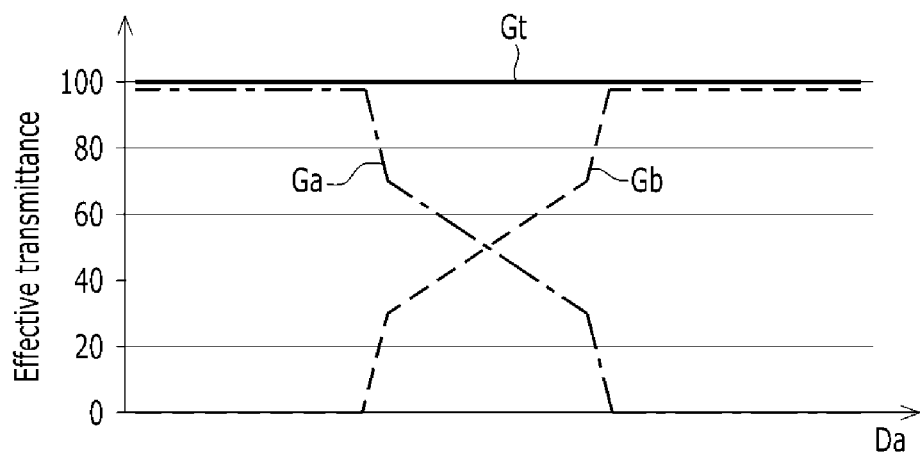
FIG. 9 is a graph of effective transmittance according to the relative positions of the photo-masks of FIG. 8.
Figure 10:
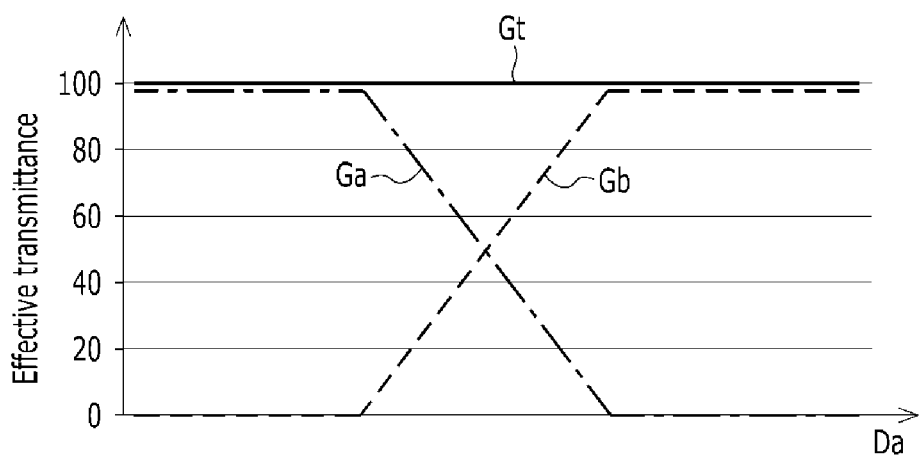
FIG. 10, FIG. 11, and FIG. 12 are graphs of effective transmittance according to the relative positions of photo-masks according to another exemplary embodiment of the present invention.
Figure 11:
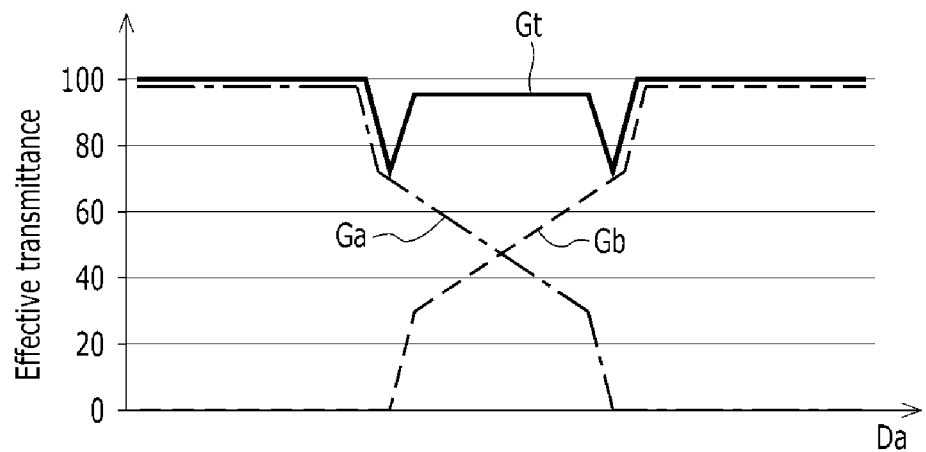
Figure 12:
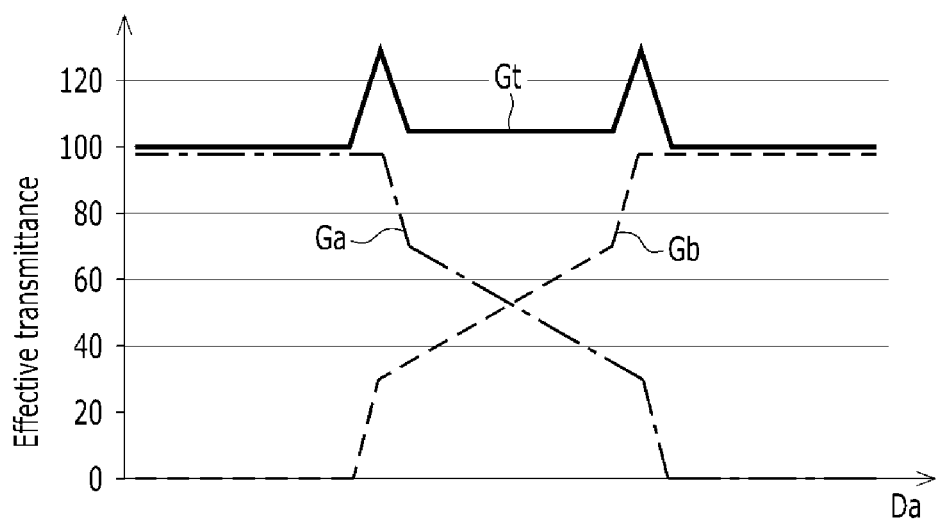
Figure 13:
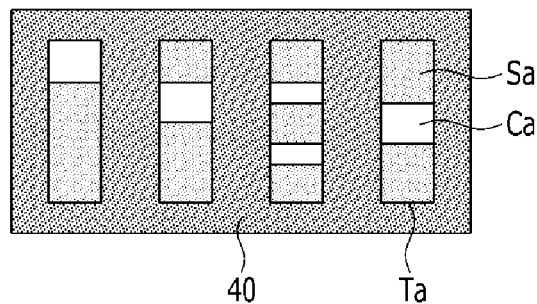
FIG. 13 is a top plan view of a portion of a photo-mask for use in a photo-alignment process according to an exemplary embodiment of the present invention.

FIG. 8 is a top plan view of photo-masks for use in a photo-alignment process according to an exemplary embodiment of the present invention, and FIG. 9 is a graph showing effective transmittance according to the related positions of the photo-masks of FIG. 8. Furthermore, FIG. 10, FIG. 11, and FIG. 12 are graphs showing effective transmittance according to the relative positions of photo-masks according to another exemplary embodiment 410 of the present invention, and FIG. 13 is a top plan view of a portion of a photo-mask for use in a photo-alignment process according to an exemplary embodiment of the present invention.

An exposure apparatus according to an exemplary embodiment of the present invention may include at least two photo-mask rows. Each photo-mask row may include at least two photo-masks, and at least portions of two photo-masks included in the neighboring photo-mask rows may overlap each other. As described above, two photo-masks including the overlapping portions are denoted by a first photo-mask 40a and a second photo-mask 40b.

The first and second photo-masks 40a and 40b according to an exemplary embodiment of the present invention respectively may include a plurality of transmission parts Ta and light blocking parts Oa, and the shapes and the arrangements of the transmission parts Ta and the light blocking parts Oa may be variously changed. The first photo-mask 40a and the second photo-mask 40b each may pass light from a light source (not shown) as in FIG. 2.

The first and second photo-masks 40a and 40b may scan the display panels 100 and 200 in the second direction Db, and the light such as ultraviolet beams may be obliquely irradiated with respect to the surface of the display panels 100

TABLE 1

| Semi-transmission section area (%) | Effective transmittance of a transmission part Ta Semi-transmission section transmittance | | | | | | | | | |
|---|---|---|---|---|---|---|---|---|---|---|
| | 10% | 20% | 30% | 40% | 50% | 60% | 70% | 80% | 90% | 100% |
| 5% | 95 | 84 | 74 | 63 | 53 | 42 | 32 | 21 | 11 | 0 |
| 10% | 100 | 89 | 78 | 67 | 56 | 44 | 33 | 22 | 11 | 0 |
| 15% | | 94 | 82 | 71 | 59 | 47 | 35 | 24 | 12 | 0 |
| 20% | | 100 | 88 | 75 | 63 | 50 | 38 | 25 | 13 | 0 |
| 25% | | | 93 | 80 | 67 | 53 | 40 | 27 | 13 | 0 |
| 30% | | | 100 | 86 | 71 | 57 | 43 | 29 | 14 | 0 |
| 35% | | | | 92 | 77 | 62 | 46 | 31 | 15 | 0 |
| 40% | | | | 100 | 83 | 67 | 50 | 33 | 17 | 0 |
| 45% | | | | | 91 | 73 | 55 | 36 | 18 | 0 |
| 50% | | | | | 100 | 80 | 60 | 40 | 20 | 0 |
| 55% | | | | | | 89 | 67 | 44 | 22 | 0 |
| 60% | | | | | | 100 | 75 | 50 | 25 | 0 |
| 65% | | | | | | | 86 | 57 | 29 | 0 |
| 70% | | | | | | | 100 | 67 | 33 | 0 |

Referring to FIG. 5, in the present exemplary embodiment, a plurality of transmission parts Ta may be arranged at predetermined intervals in the first direction Da, and the ratio of an area for the transmission part Ta of the transmission part Sa along the first direction Da may be gradually decreased such that the effective transmittance of the transmission part Ta may be also decreased along the first direction Da.

Referring to FIG. 6, in the present exemplary embodiment, the thickness of the semi-transmission layer 60 disposed at and 200. Here, some portions of the first and second photo-masks 40a and 40b overlap each other, and these portions scan the same regions of the display panels 100 and 200. The region that does not overlap with the second photo-mask 40b in the first photo-mask 40a is the first region A, the region that does not overlap with the first photo-mask 40a in the second photo-mask 40b is the second region B, and the region where the first and second photo-masks 40a and 40b overlap each other is an overlapping region AB.

In all regions A, B, and AB, the transmission parts Ta of the first and second photo-masks 40a and 40b may be arranged with the predetermined interval along the first direction D perpendicular to the second direction Db, and the pitch of the arranged transmission part Ta, that is, a distance between the same edges of the neighboring transmission parts Ta, may be equal to the length of a pixel PX in the first direction Da. Each transmission part Ta may be rectangular shaped in general, although it is not limited thereto. The transmission part Ta may include a longitudinal edge substantially parallel to the second direction Db and a transverse edge substantially parallel to the first direction Da. The length of the transverse edge may be a half pitch of a pixel PX, that is, half of the length of a pixel PX in the first direction Da. In all regions A, B, and AB, the shapes of the transmission parts Ta may be the same, and in the overlapping region AB, the length of the second direction Db of the transmission part Ta may be greater than the length of the second direction Db of the transmission part Ta of the first region A and the second region B.

The transmission part Ta of the first region A and the second region B may, or may not include a semi-transmission section Sa such that the effective transmittance of each transmission part Ta is about 100% and it may be constantly maintained along the first direction Da.

In the overlapping region AB, the corresponding transmission parts Ta of the first photo-mask 40a and the second photo-mask 40b may scan and expose the same region, which is an overlapping exposure region, of the display panels 100 and 200. At this time, the sum of the effective transmittance of the transmission part Ta of the first photo-mask 40a and the effective transmittance of the transmission part Ta of the second photo-mask 40b corresponding to the overlapped exposure region may be substantially the same as an effective transmittance of a transmission part Ta of the first region A or the second region B. Specifically, considering the intensity of the light source and the alignment margin, a sum of an effective transmittance of the transmission part Ta of the first photo-mask 40a and an effective transmittance of the transmission part Ta of the second photo-mask 40b where the irradiation regions corresponding to the transmission parts Ta are overlapped may be about 70-120% in the overlapping region AB. However, the effective transmittance of each of the first photo-mask 40a and the second photo-mask 40b may be constant or vary along the first direction Da.

Referring to FIG. 8 and FIG. 9, in the overlapping region AB, at least one transmission part Ta included in at least one of the first and second photo-masks 40a and 40b according to an exemplary embodiment of the present invention may include the semi-transmission section Sa.

Specifically, the areas of the semi-transmission sections Sa of the first photo-mask 40a in the overlapping region AB may be gradually increased along the first direction Da, and thereby the effective transmittance may be gradually decreased along the first direction Da. Meanwhile, the areas of the semi-transmission sections Sa in the transmission parts Ta of the second photo-mask 40b may be gradually decreased along the first direction Da, and thereby the effective transmittance may be gradually increased in the first direction Da. In this case, the transmittance of the semi-transmission sections Sa of the first and second photo-masks 40a and 40b may be constant. However, the transmittance of the semi-transmission sections Sa of the first and second photo-masks 40a and 40b may vary while maintaining the sum of the effective transmittance of the corresponding semi-transmission sections Sa of the first and second photo-masks 40a and 40b in the range of 70-120%.

In the present exemplary embodiment, the change in a ratio of an area of the semi-transmission section Sa with respect to an area of the transmission part Ta may be made with various functions such as a linear function or a trigonometric function according to the relative position of the transmission part Ta having the semi-transmission section Sa in either the first photo-mask 40a or the second photo-mask 40b along the first direction Da.

The graphs in FIG. 9, FIG. 10, FIG. 11, and FIG. 12 show examples where the change in the area of the semi-transmission section Sa is made based on a linear function in the overlapping region AB. The graphs show the effective transmittance Ga in the first direction Da of the transmission parts Ta of the first photo-mask 40a, the effective transmittance Gb in the first direction Da of the transmission parts Ta of the second photo-mask 40b, and the sum Gt of the effective transmittance of the first and second photo-masks 40a and 40b. FIG. 9 shows an exemplary embodiment in which the effective transmittance of the transmission parts Ta of the first and second photo-masks 40a and 40b may vary in the range of 30-70%, and FIG. 10 shows an exemplary embodiment in which the effective transmittance of the transmission parts Ta of the first and second photo-masks 40a and 40b may vary in the range of 0-100%. FIG. 11 and FIG. 12 are the same as FIG. 9, except that they show the change that may be represented on the total effective transmittance Gt when the first and second photo-masks 40a and 40b are misaligned with each other or an error in the intensity of the light of the light source has occurred.

As described above, according to the present exemplary embodiment, the total effective transmittance as the sum of the effective transmittance of the corresponding transmission parts Ta may be maintained in the range of 70-120% while the effective transmittance of each transmission part Ta of the first and second photo-masks 40a and 40b may vary in the overlapping region AB such that the irradiation amount of the exposure region of the display panels 100 and 200 may be uniform depending on the relative positions of the first and second photo-masks 40a and 40b in some degree. In the overlapping region AB, although the sum of the irradiation amount of the portion exposed by the first and second photo-masks 40a and 40b may be over 100% of the irradiation amount of the irradiation region corresponding to transmission parts Ta of the first and second regions A and B, the pretilt angle of the liquid crystal molecules 31 caused by the alignment force of the alignment layers 11 and 21 does not make a large difference.

The irradiation amount for the display panels 100 and 200 by the exposure apparatus according to an exemplary embodiment of the present invention is shown in the lower part of FIG. 8. Referring to FIG. 8, the irradiation amount Edr for the display panels 100 and 200 of the light irradiated through the first and second photo-masks 40a and 40b is represented by the respective areas of the transmission parts Ta. According to the present exemplary embodiment, the irradiation amount Edr is substantially uniformly distributed regardless of the regions A, B, and AB of the first and second photo-masks 40a and 40b.

As described above, two or more photo-masks may be used in the photo-alignment process such that the manufacturing cost of the mask may be reduced and it is advantageous for manufacturing large-sized display panels 100 and 200. Also, when using two or more photo-masks, the light is irradiated through the overlapped photo-masks such that the generation of a boundary line between light irradiation regions and display defects therefrom may be reduced.

On the other hand, in the overlapping region AB, the shape of each semi-transmission section Sa of the photo-transmission part Ta may be variously changed. For example, as shown in FIG. 13, multiple segments of a semi-transmission section Sa may be provided in a photo-transmission part Ta in various manners. In this case, the sum of areas occupied by the multiple segments of a semi-transmission section Sa in each transmission part Ta may be substantially constant.

Hereinafter, various exemplary embodiments of an exposure apparatus according to an exemplary embodiment of the present invention will be described with reference to FIG. 14, FIG. 15, FIG. 16, FIG. 17, and FIG. 18.

Figure 14:
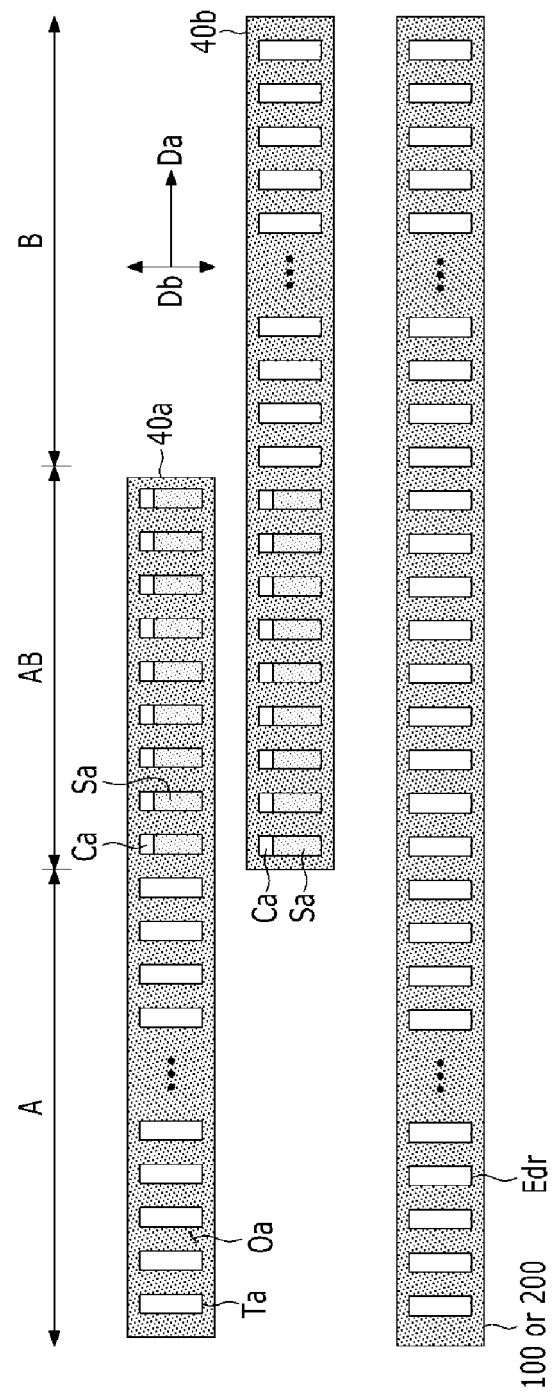
FIG. 14 is a top plan view of photo-masks for use in a photo-alignment process according to an exemplary embodiment of the present invention.
Figure 15:
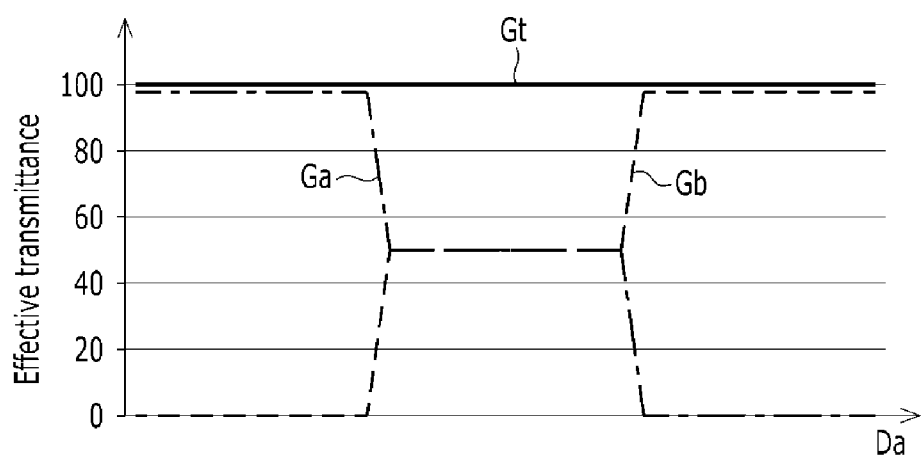
FIG. 15 is a graph of effective transmittance according to relative positions of the photo-masks shown in FIG. 14.

FIG. 14 is a top plan view of photo-masks for use in a photo-alignment process according to an exemplary embodiment of the present invention, and FIG. 15 is a graph of effective transmittance according to the relative positions of the photo-masks shown in FIG. 14.

The first and second photo-masks 40a and 40b according to the present exemplary embodiment are substantially the same as the exemplary embodiment of FIG. 8 to FIG. 12, and the area of the semi-transmission section Sa for each transmission part Ta in the overlapping region AB is substantially constant. However, like the above exemplary embodiment, the sum of the effective transmittance of the first and second photo-masks 40a and 40b may be maintained at 70-120%. In some exemplary embodiments, the sum of the effective transmittance of the first and second photo-masks 40a and 40b may be maintained at about 100%.

In the overlapping region AB, the ratio of the area and the transmittance of the semi-transmission section Sa of the first and second photo-masks 40a and 40b in each of the transmission parts Ta may be constant such that the effective transmittance may also be uniform accordingly. Also, as shown in FIG. 15, the effective transmittance Ga and Gb of the first and second photo-masks 40a and 40b may be respectively about 50% such that the total effective transmittance Gt for the overlapping exposure region may be about 100%. FIG. 14 is the exemplary embodiment in which the ratio of an area of the semi-transmission section Sa with respect to the transmission part Ta may be about 75% and the transmittance of the semi-transmission section Sa may be about 33%, while it may be variously controlled.

In the present exemplary embodiment, the irradiation amount Edr for the transmission part Ta of the first and second photo-masks 40a and 40b may be substantially uniformly distributed regardless of the region A, B, and AB of the first and second photo-masks 40a and 40b.

Figure 16:
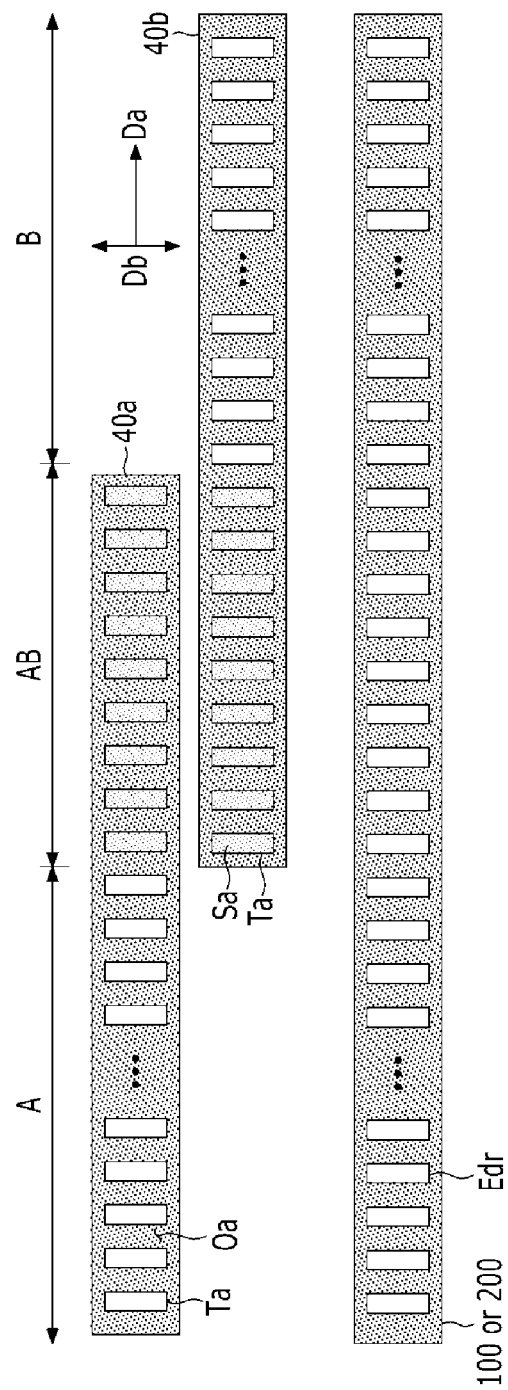
FIG. 16 is a top plan view of photo-masks for use in a photo-alignment process 130 according to an exemplary embodiment of the present invention.
Figure 17:
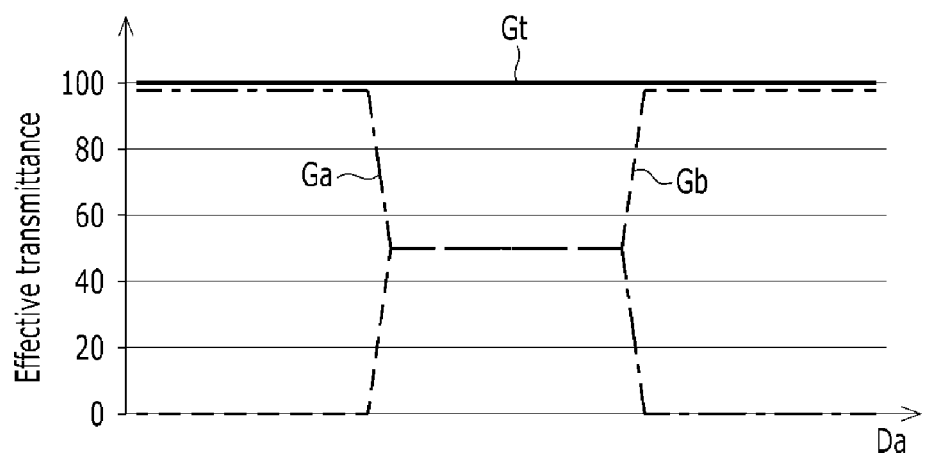
FIG. 17 is a graph of effective transmittance according to the relative positions of the photo-masks shown in FIG. 16.
Figure 18:
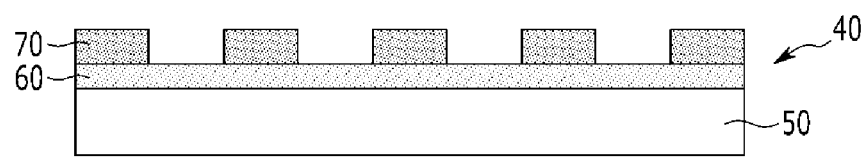
FIG. 18 is a cross-sectional view of a portion of one of the photo-masks shown in FIG. 16.

FIG. 16 is a top plan view of photo-masks for use in a photo-alignment process according to an exemplary embodiment of the present invention, FIG. 17 is a graph of effective transmittance according to the relative positions of the photo-masks shown in FIG. 16, and FIG. 18 is a cross-sectional view of a portion of one of the photo-masks shown in FIG. 16.

The first and second photo-masks 40a and 40b according to the exemplary embodiment shown in FIG. 16, FIG. 17, and FIG. 18 are substantially the same as in the exemplary embodiment shown in FIG. 8 to FIG. 12, except that the ratio of an area of the semi-transmission sections Sa for the transmission parts Ta is uniform at 100% in the overlapping region AB. In the overlapping region AB, the effective transmittance Ga and Gb of each transmission part Ta of the first and second photo-masks 40a and 40b may be constant at about 50%, and the sum Gt of the effective transmittance of the transmission part Ta of the first and second photo-masks 40a and 40b may be maintained at about 100%, like the first region A and the second region B. The transmittance of the semi-transmission section Sa may be constant at about 50%.

Referring to FIG. 18, the semi-transmission layer 60 of the first and second photo-masks (each represented by 40) may have the same thickness irrespective of its relative position on the substrate 50 such that the transmittance of the semi-transmission sections Sa may also be uniform.

In the present exemplary embodiment, the irradiation amount Edr through the transmission part Ta may be uniformly distributed regardless of the regions A, B, and AB of the first and second photo-masks 40a and 40b.

Figure 19:
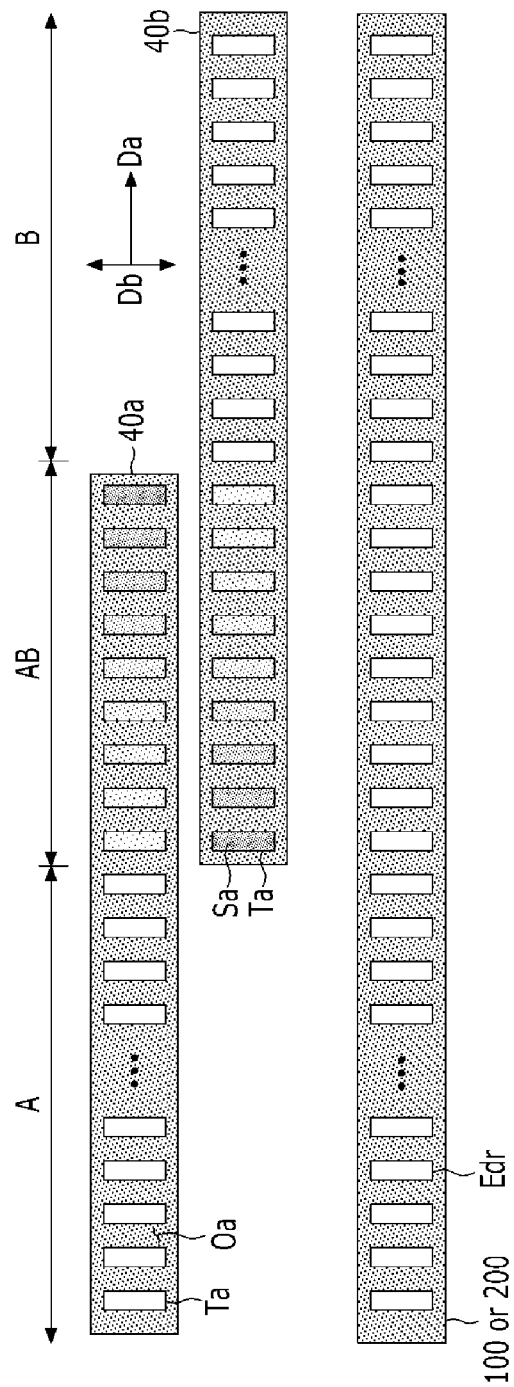
FIG. 19 is a top plan view of photo-masks for use in a photo-alignment process according to an exemplary embodiment of the present invention.
Figure 20:
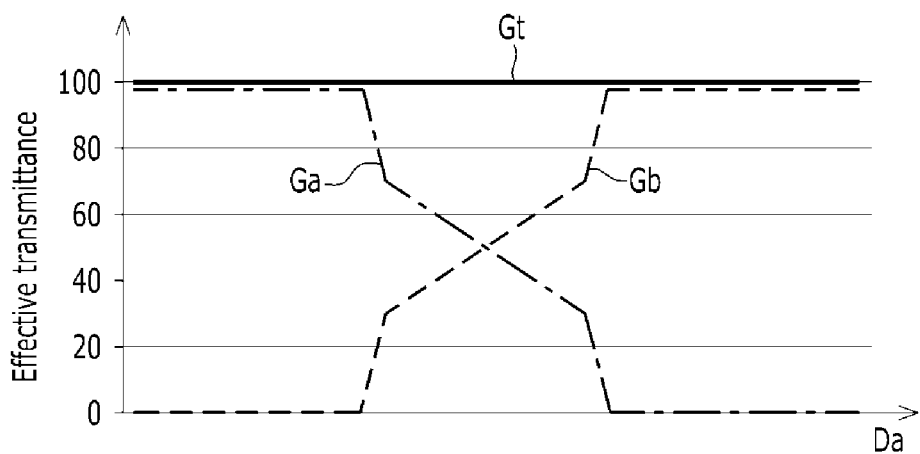
FIG. 20 is a graph of effective transmittance according to the relative positions of the photo-masks shown in FIG. 19.
Figure 21:
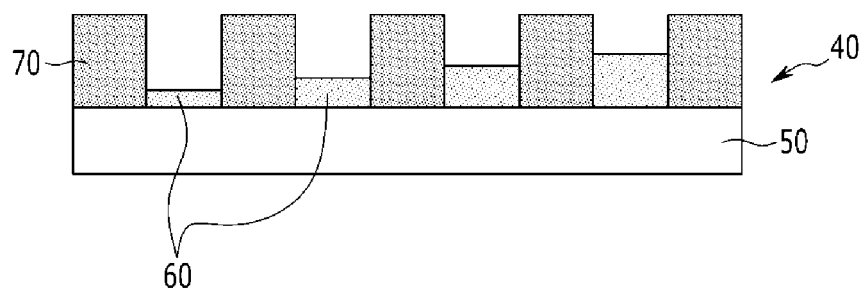
FIG. 21 is a cross-sectional view of a portion of one of the photo-masks shown in FIG. 19.

FIG. 19 is a top plan view of photo-masks for use in a photo-alignment process according to an exemplary embodiment of the present invention, FIG. 20 is a graph of effective transmittance according to the relative positions of the photo-masks shown in FIG. 19, and FIG. 21 is a cross-sectional view of a portion of one of the photo-masks shown in FIG. 19.

The first and second photo-masks 40a and 40b according to the exemplary embodiment shown in FIG. 19, FIG. 20, and FIG. 21 are the same as of the exemplary embodiment shown in FIG. 16 to FIG. 18, except that the transmittance of the semi-transmission sections Sa is not constant but varies along the first direction Da in the overlapping region AB. In FIG. 19, it is shown that the semi-transmission sections Sa are thicker than the light blocking part Oa, however this is only to show the change in the transmittance of the semi-transmission sections Sa, and the transmittance of the actual semi-transmission sections Sa is not lower than the transmittance of the light blocking part Oa.

Specifically, the ratio of areas that the semi-transmission sections Sa occupy in the transmission parts Ta in the overlapping region AB may be constant at 100%, however the transmittance of the semi-transmission sections Sa may vary along the first direction Da. The transmittance of the semi-transmission sections Sa of the first photo-mask 40a and the effective transmittance Ga of the transmission parts Ta may be gradually decreased along the first direction Da, and the transmittance of the semi-transmission sections Sa of the second photo-mask 40b and the effective transmittance Gb of the transmission parts Ta may be gradually increased along the first direction Da. As shown in FIG. 21, the increasing and decreasing transmittance of the semi-transmission sections Sa may be controlled by increasing and decreasing the thickness of the semi-transmission layer 60 included in the first and second photo-masks 40a and 40b. However, it is not limited thereto, and the transmittance of the semi-transmission section Sa may be controlled by changing the kind of the material according to the relative position of the semi-transmission layer 60.

FIG. 19 and FIG. 20 show the transmission parts Ta of the first and second photo-masks 40a and 40b of which the effective transmittance is increased and decreased in the range of 30-70%, however the change in range of the effective transmittance may be variously controlled in the overlapping region AB.

In the present exemplary embodiment, the sum Gt of the effective transmittance of each of the transmission part Ta of the first photo-mask 40a and the corresponding transmission part Ta of the second photo-mask 40b may be maintained at about 100%, like the first region A and the second region B. The irradiation amount Edr through the transmission parts Ta may be substantially uniformly distributed regardless of the regions A, B, and AB of the first and second photo-masks 40a and 40b.

In the above-described exemplary embodiment, the number of transmission parts Ta in the overlapping region AB may be from 10 to 30, although it is not limited thereto. Also, the length of the overlapping region AB along the first direction Da may be in the range of 10-100 mm, although it is not limited thereto.

Hereinafter, a method for photo-alignment and photo-masks for the method according to another exemplary embodiment of the present invention will be described with reference to FIG. 22 and FIG. 23.

Figure 23:
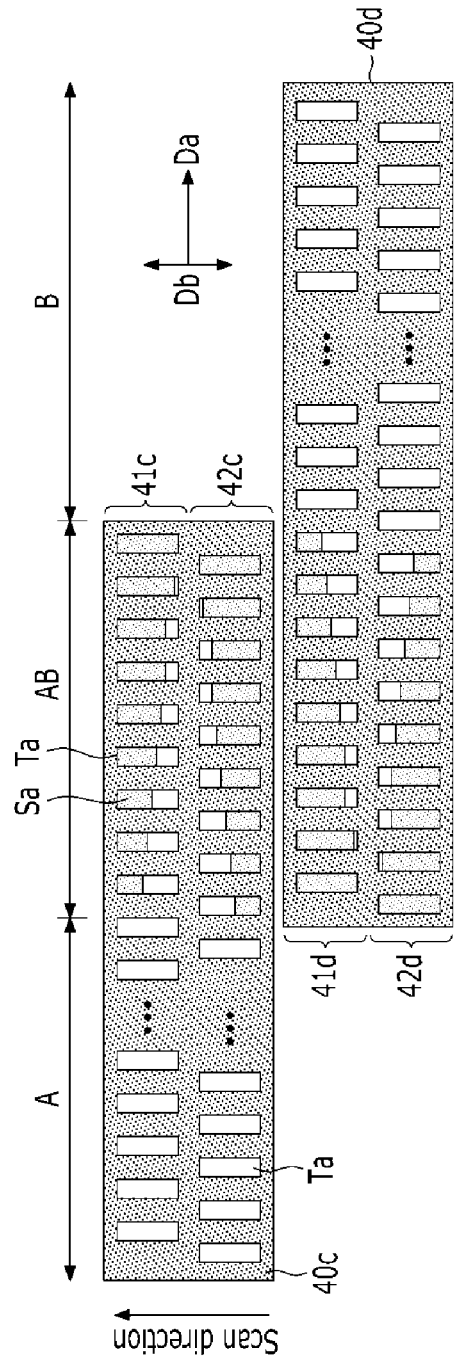
FIG. 23 is a top plan view showing one exemplary embodiment of photo-masks for use in the photo-alignment process shown in FIG. 22.

FIG. 22 is a view showing a photo-alignment process according to an exemplary embodiment of the present invention, and FIG. 23 is a top plan view showing an exemplary embodiment of photo-masks for use in the photo-alignment process shown in FIG. 22.

Referring to FIG. 22, a plurality of domains having different alignment directions for a pixel PX may be formed through an exposure process. This is referred to a dual exposure process. The dual exposure apparatus according to the present exemplary embodiment may use two light sources and a plurality of minors and polarizers as shown in FIG. 22 (a) to perform the exposure in various directions to the display panels 100 and 200. In the exemplary embodiment shown in FIG. 22 (b), a light source and a plurality of minors and beam splitters BS may be used to execute the exposure having different irradiation directions. Here, the photo-mask 40 may include two portions 41 and 42 corresponding to the different irradiation regions, and the transmission parts of the two portions 41 and 42 may be irradiated with the light through the different irradiation directions.

Referring to FIG. 23, a first photo-mask 40c for the dual exposure process according to an exemplary embodiment of the present invention may include a first row 41c and a second row 42c neighboring each other in the second direction Db, and a second photo-mask 40d may include a first row 41d and a second row 42d neighboring each other in the second direction Db.

In the first region A and the second region B in which the first and second photo-masks 40c and 40d are not overlapped with each other, the transmission parts Ta of the first row 41c of the first photo-mask 40c and the transmission parts Ta of the second row may be alternately provided, and each of the transmission parts Ta of the second row may be provided between the neighboring transmission parts Ta of the first row 41c. The length of each of the transmission parts Ta of the first row 41c or the second row 42c in the first direction Da is substantially the same as half of the length of the pixel PX in the first direction Da.

In the overlapping region AB of the first and second photo-masks 40c and 40d, the irradiation region of the transmission parts Ta of the first row 41c of the first photo-mask 40c and the first row 41d of the second photo-mask 40d may be overlapped with each other, and the irradiation region of the transmission parts Ta of the second row 42c of the first photo-mask 40c and the second row 41d of the second photo-mask 40 may be overlapped with each other.

The area occupied by the semi-transmission sections Sa in the transmission parts Ta of the first row 41c of the first photo-mask 40c may be gradually increased or decreased along the first direction Da such that the effective transmittance of the transmission parts Ta may be decreased or increased, or the area occupied by the semi-transmission sections Sa in the transmission parts Ta of the first row 41d of the second photo-mask 40d may be gradually increased or decreased along the first direction Da such that the effective transmittance may be decreased or increased. Accordingly, in the present exemplary embodiment, the sum of the effective transmittance of the transmission parts Ta of the first row 41c of the first photo-mask 40c and the effective transmittance of the corresponding transmission parts Ta of the first row 41d of the second photo-mask 40d may be uniform in the range of 70-120% irrespective of the relative positions of the transmission parts Ta. This may be equally applicable to the second row 42d of the first photo-mask 40c and the second row 42d of the second photo-mask 40d.

Various characteristics of the above-described exemplary embodiments may be applied to the present exemplary embodiment.

Hereinafter, photo-masks for use in a photo-alignment process according to an exemplary embodiment of the present invention will be described with reference to FIG. 24, FIG. 25, and FIG. 26. The same constituent elements as in the exemplary embodiment described above are granted the same reference numerals and the same descriptions are omitted.

Figure 24:
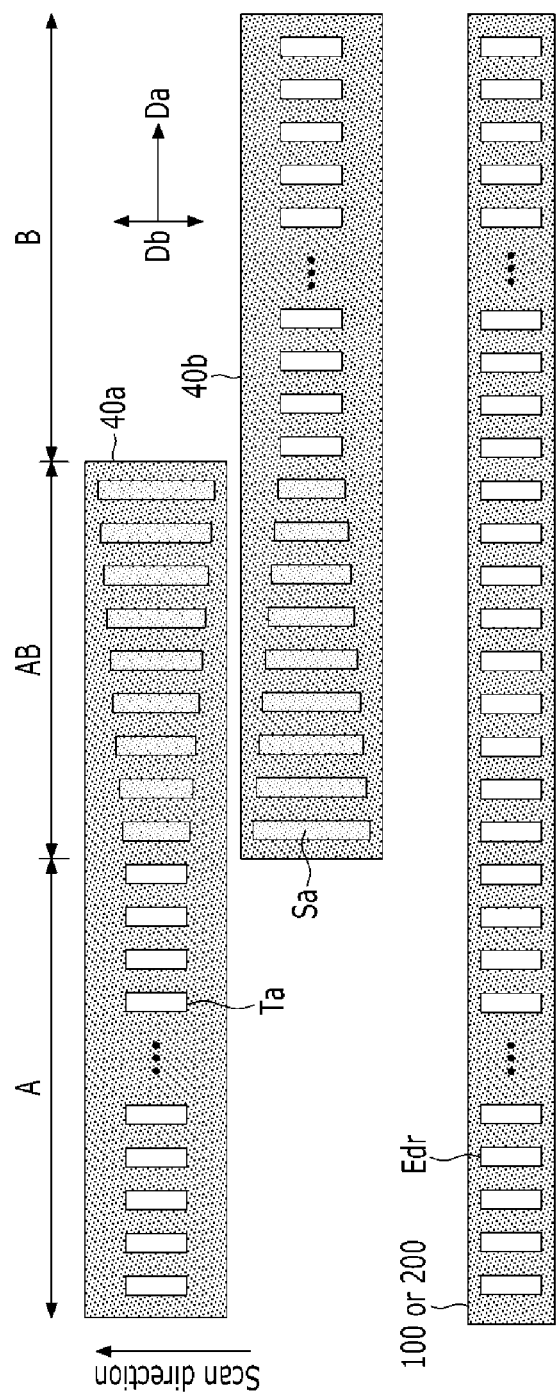
FIG. 24, FIG. 25, and FIG. 26 are top plan views of photo-masks for use in a photo-alignment process according to an exemplary embodiment of the present invention.
Figure 25:
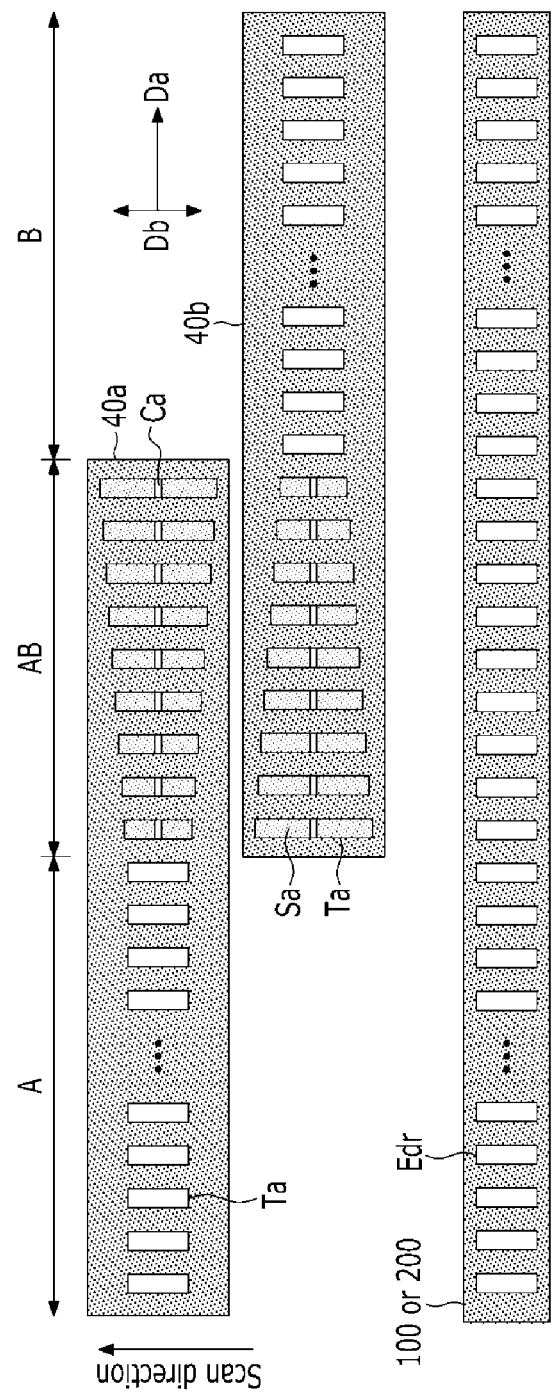
Figure 26:
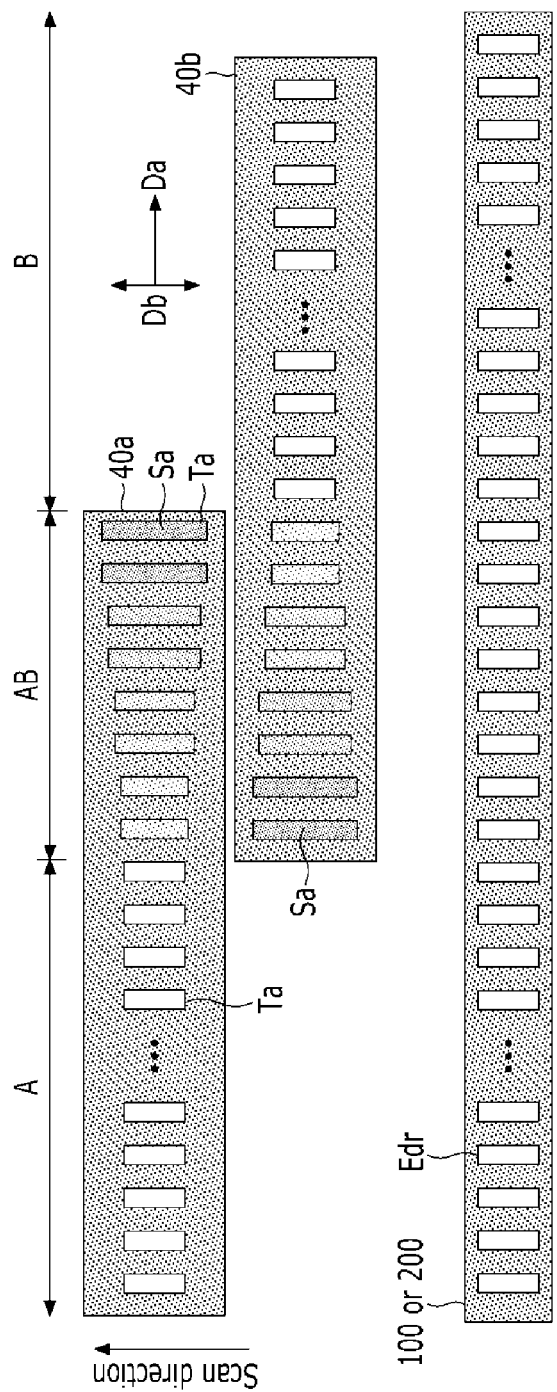

FIG. 24, FIG. 25, and FIG. 26 are top plan views of photo-masks for use in a photo-alignment process according to an exemplary embodiment of the present invention.

Firstly, referring to FIG. 24, the first and second photo-masks 40a and 40b according to the present exemplary embodiment are substantially the same as the photo-masks of the exemplary embodiment shown in FIG. 16 to FIG. 18, except that the length of each of the transmission parts Ta in the first direction Da varies according to the relative position of the transmission parts Ta in the overlapping region AB.

Specifically, in the overlapping region AB, the area of the transmission parts Ta of the first photo-mask 40a may be gradually increased along the first direction Da. For example, the areas of the transmission parts Ta may be increased by increasing the lengths in the second direction Db or in the longitudinal direction of the transmission parts Ta of the first photo-mask 40a in the overlapping region AB. Also, the areas of the transmission parts Ta of the second photo-mask 40b may be gradually decreased along the first direction Da, and the areas of the transmission parts Ta may be decreased by gradually decreasing the lengths of the transmission parts Ta of the second photo-mask 40b in the second direction Db in the present exemplary embodiment. Here, the change in the area or in the length in the longitudinal direction of the transmission part Ta along the first direction Da may depend on various functions such as a linear function and a trigonometric function, and the transmittance of the semi-transmission section Sa may be appropriately controlled accordingly. Also, the length of the transmission part Ta in the longitudinal direction may be changed in the range of 100-190% of the length in the longitudinal direction of the transmission part Ta in the first region A or the second region B.

Also, in the present exemplary embodiment, the sum of the effective transmittance of each of the transmission parts Ta of the first photo-mask 40a and the corresponding transmission part Ta of the second photo-mask 40b in the overlapping region AB may be constant in the range of 70-120%. Accordingly, as shown in the lower part of FIG. 24, the irradiation amount Edr through each of the transmission parts Ta may be uniformly distributed regardless of the regions A, B, and AB of the first and second photo-masks 40a and 40b.

Next, referring to FIG. 25, the first and second photo-masks 40a and 40b according to the present exemplary embodiment are substantially the same as the photo-mask shown in FIG. 24, except that some transmission part Ta includes the full transmission section Ca as well as the semi-transmission section Sa in the overlapping region AB. In this case, the sum of the effective transmittance of the transmission part Ta of the first and second photo-masks 40a and 40b may be substantially constant in the range of 70-120% according to the position.

In the overlapping region AB, the ratio of the full transmission section Ca for the transmission part Ta, the length in the longitudinal direction of the transmission part Ta, and the transmittance of the semi-transmission section Sa may be appropriately controlled. For example, in the present exemplary embodiment, the length in the longitudinal direction of the transmission parts Ta in the overlapping region AB may be gradually changed in the range of 100-180% of the length in the longitudinal direction of the transmission part Ta of the first region A or the second region B. Also, the length in the longitudinal direction of the full transmission section Ca may be about 10% of the length in the longitudinal direction of the transmission part Ta of the first region A or the second region B, and the length in the longitudinal direction of the semi-transmission section Sa may be about 100-170% of the length in the longitudinal direction of the transmission part Ta of the first region A or the second region B.

In the present exemplary embodiment, the length in the longitudinal direction of the full transmission section Ca along the first direction Da or the second direction Db may be constant, or the length in the longitudinal direction of the semi-transmission section Sa may be constant and the length in the longitudinal direction of the full transmission section Ca may be changed. Also, in the overlapping region AB, the effective transmittance along the first direction Da of the first and second photo-masks 40a and 40b is not changed but may be maintained at about 50%.

Also, the various characteristics of FIG. 24 may be applied to the present exemplary embodiment.

Next, referring to FIG. 26, the first and second photo-masks 40a and 40b of the present exemplary embodiment are substantially the same as the photo-mask of FIG. 19 to FIG. 21, except that the lengths of the transmission parts Ta along the first direction Da may be changed according to the relative positions of the transmission parts Ta in the overlapping region AB.

Specifically, in the overlapping region AB, while the ratio of areas occupied by the semi-transmission sections Sa in the transmission parts Ta of the first and second photo-masks 40a and 40b may be 100%, the transmittance of the semi-transmission sections Sa of the first photo-mask 40a along the first direction Da may be gradually decreased along the first direction Da and the transmittance of the semi-transmission sections Sa of the second photo-mask 40b along the first direction Da may be gradually increased along the first direction Da. Also, in the overlapping region AB, the length of the transmission parts Ta of the first photo-mask 40a in the longitudinal direction may be gradually increased and the length of the transmission part Ta of the second photo-mask 40b in the longitudinal direction may be gradually decreased. For example, in the overlapping region AB, the transmittance of the semi-transmission sections Sa of the first and second photo-masks 40a and 40b may be changed in the range of 20-50%, and the lengths in the longitudinal direction of the transmission parts Ta may be changed in the range of 100-250% of the lengths in the longitudinal direction of the transmission parts Ta of the first region A or the second region B.

As described above, if the transmittance of the semi-transmission sections Sa and the length in the longitudinal direction may be appropriately controlled, the effective transmittance along the first direction Da of the first and second photo-masks 40a and 40b may be constant in the overlapping region AB. Also, in the overlapping region AB, the sum of the effective transmittance of the transmission parts Ta of the corresponding first and second photo-masks 40a and 40b may be substantially constant in the range of 70-120%. Accordingly, as shown in the lower part of FIG. 26, the irradiation amount Edr through each of the transmission parts Ta may be uniformly distributed regardless of the regions A, B, and AB of the first and second photo-masks 40a and 40b.

As described above, the photo-alignment process may be executed by using the first and second photo-masks 40a and 40b according to the various exemplary embodiments of the present invention such that the boundary line between the exposure regions of the different photo-masks may be smooth while reducing the manufacturing cost of the photo-mask, and the alignment margin of the photo-mask may be increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An exposure apparatus, comprising:
a first photo-mask comprising a light blocking layer and transmission parts disposed in the light blocking layer and through which light is transmitted, the transmission parts being arranged in a first direction and separated from each other; and
a second photo-mask comprising a light blocking layer and transmission parts disposed in the light blocking layer and through which light is transmitted, the transmission parts being arranged in the first direction and separated from each other, the first photo-mask and the second photo-mask comprising an overlapping region where a plurality of the transmission parts of each of the first photo-mask and the second photo-mask are overlapped with each other,
wherein:
the overlapped transmission parts comprise semi-transmission sections each comprising a semi-transmission layer; and
a ratio of an area occupied by the semi-transmission section in each of the overlapped transmission parts is gradually increased or decreased for different transmission parts along the first direction.

2. The exposure apparatus of claim 1, wherein an irradiation region of a transmission part of the first photo-mask and an irradiation region of a transmission part of the second photo-mask are overlapped in the overlapping region.

3. The exposure apparatus of claim 2, wherein a sum of effective transmittances of the overlapping transmission parts is 70-120% of an effective transmittance of a transmission part outside the overlapping region.

4. The exposure apparatus of claim 3, wherein the ratio of the area occupied by the semi-transmission section of each of the overlapped transmission parts is in a range of 0 to 100%.

5. The exposure apparatus of claim 3, wherein lengths of the overlapped transmission parts gradually decrease or increase along the first direction.

6. The exposure apparatus of claim 5, wherein
a transmittance of the semi-transmission section in at least one transmission part in the overlapping region is constant along the first direction.

7. The exposure apparatus of claim 5, wherein
a transmittance of the semi-transmission section in at least one transmission part in the overlapping region is gradually decreased or increased along the first direction.

8. The exposure apparatus of claim 1, wherein the overlapped transmission parts each further comprise a full transmission section having a transmittance of about 100%.

9. The exposure apparatus of claim 1, wherein at least one of the first photo-mask and the second photo-mask further comprises a substrate upon which the blocking layer and the semi-transmission layers are disposed.

10. An exposure apparatus, comprising:
a first photo-mask comprising a light blocking layer and transmission parts disposed in the light blocking layer and through which light is transmitted, the transmission parts being arranged in a first direction and separated from each other; and
a second photo-mask comprising a light blocking layer and transmission parts disposed in the light blocking layer and through which light is transmitted, the transmission parts being arranged in the first direction and separated from each other, the first photo-mask and the second photo-mask comprising an overlapping region where a plurality of the transmission parts of each of the first photo-mask and the second photo-mask are overlapped with each other,
wherein:
the overlapped transmission parts comprise semi-transmission sections each comprising a semi-transmission layer;
the overlapped transmission parts each is totally occupied by the semi-transmission section; and
a transmittance of the semi-transmission layer in each of the overlapped transmission parts gradually increases or decreases for different transmission parts along the first direction.

11. The exposure apparatus of claim 10, wherein the transmittance of at least one of the semi-transmission sections is 50%.

12. An exposure apparatus, comprising:
a first photo-mask comprising a light blocking layer and transmission parts disposed in the light blocking layer and through which light is transmitted, the transmission parts being arranged in a first direction and separated from each other; and
a second photo-mask comprising a light blocking layer and transmission parts disposed in the light blocking layer and through which light is transmitted, the transmission parts being arranged in the first direction and separated from each other, the first photo-mask and the second photo-mask comprising an overlapping region where a plurality of the transmission parts of each of the first photo-mask and the second photo-mask are overlapped with each other,
wherein:
the overlapped transmission parts comprise semi-transmission sections each comprising a semi-transmission layer;
the overlapped transmission parts each is totally occupied by the semi-transmission section; and
lengths of the overlapped transmission parts gradually decrease or increase along the first direction.

13. The exposure apparatus of claim 12, wherein a transmittance of the semi-transmission section in at least one transmission part in the overlapping region is constant along the first direction.

14. A method for manufacturing a liquid crystal display with an exposure apparatus having a first photo-mask and a second photo-mask, the method comprising:
coating an alignment layer comprising a photo-reactive alignment material on a substrate; and
irradiating light to the alignment layer through the first photo-mask and the second photo-mask,
wherein:
the first photo-mask comprises a light blocking layer and transmission parts disposed in the light blocking layer and through which light is transmitted, the transmission parts being arranged in a first direction and separated from each other; and
the second photo-mask comprises a light blocking layer and transmission parts disposed in the light blocking layer and through which light is transmitted, the transmission parts being arranged in the first direction and separated from each other, the first photo-mask and the second photo-mask comprising an overlapping region where a plurality of the transmission parts of each of the first photo-mask and the second photo-mask are overlapped with each other,
wherein:
the overlapped transmission parts comprise semi-transmission sections each comprising a semi-transmission layer; and
a ratio of an area occupied by the semi-transmission section in each of the overlapped transmission parts is gradually increased or decreased for different transmission parts along the first direction.

15. A method for manufacturing a liquid crystal display with an exposure apparatus having a first photo-mask and a second photo-mask, the method comprising:
coating an alignment layer comprising a photo-reactive alignment material on a substrate; and
irradiating a first light beam and a second light beam, having different irradiation directions from each other, through the transmission parts of the first portion and the transmission parts of the second portion onto the alignment layer, respectively,
wherein:
the first photo-mask comprises a light blocking layer and transmission parts disposed in the light blocking layer and through which light is transmitted, the transmission parts being arranged in a first direction and separated from each other; and
the second photo-mask comprises a light blocking layer and transmission parts disposed in the light blocking layer and through which light is transmitted, the transmission parts being arranged in the first direction and separated from each other, the first photo-mask and the second photo-mask comprising an overlapping region where a plurality of the transmission parts of each of the first photo-mask and the second photo-mask are overlapped with each other,
wherein:
the overlapped transmission parts comprise semi-transmission sections each comprising a semi-transmission layer;
the overlapped transmission parts each is totally occupied by the semi-transmission section; and
a transmittance of the semi-transmission layer in each of the overlapped transmission parts gradually increases or decreases for different transmission parts along the first direction.

* * * * *